(12) United States Patent
Saka et al.

(10) Patent No.: US 10,847,466 B2
(45) Date of Patent: Nov. 24, 2020

(54) FIELD-EFFECT TRANSISTOR, METHOD OF MANUFACTURING THE SAME, AND RADIO-FREQUENCY DEVICE

(71) Applicant: Sony Corporation, Tokyo (JP)

(72) Inventors: Naoki Saka, Kanagawa (JP); Daisaku Okamoto, Kagoshima (JP); Hideki Tanaka, Kagoshima (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/700,703

(22) Filed: Dec. 2, 2019

(65) Prior Publication Data

US 2020/0118928 A1 Apr. 16, 2020

Related U.S. Application Data

(63) Continuation of application No. 16/050,815, filed on Jul. 31, 2018, now Pat. No. 10,535,607, which is a (Continued)

(30) Foreign Application Priority Data

Apr. 18, 2014 (JP) ................................ 2014-086805

(51) Int. Cl.
*H01L 23/535* (2006.01)
*H01L 23/482* (2006.01)
(Continued)

(52) U.S. Cl.
CPC ........ *H01L 23/535* (2013.01); *H01L 23/4824* (2013.01); *H01L 23/528* (2013.01);
(Continued)

(58) Field of Classification Search
CPC ......... H01L 2924/00; H01L 2924/0002; H01L 21/7682; H01L 23/53295; H01L 23/5222; H01L 21/764
(Continued)

(56) References Cited

U.S. PATENT DOCUMENTS 6,717,267 B1 * 4/2004 Kunikiyo ............ H01L 23/5283
257/758
2004/0119134 A1 6/2004 Goldberg et al.
(Continued)

FOREIGN PATENT DOCUMENTS

| CN | 100378948 C | 4/2008 |
|---|---|---|
| JP | 64-045120 | 2/1989 |

(Continued)

OTHER PUBLICATIONS

Japanese Office Action dated Feb. 18, 2020 for corresponding Japanese Application No. 2015-191436.
(Continued)

*Primary Examiner* — Jonathan Han
(74) *Attorney, Agent, or Firm* — Michael Best & Friedrich LLP

(57) ABSTRACT

There is provided a field-effect transistor including: a gate electrode; a semiconductor layer having a source region and a drain region with the gate electrode in between; contact plugs provided on the source region and the drain region; first metals stacked on the contact plugs; and a low-dielectric constant region provided in a region between the first metals along an in-plane direction of the semiconductor layer and provided at least in a first region below bottom surfaces of the first metals along a stacking direction.

29 Claims, 38 Drawing Sheets

Related U.S. Application Data continuation of application No. 15/499,195, filed on Apr. 27, 2017, now Pat. No. 10,074,610, which is a continuation of application No. 14/897,867, filed as application No. PCT/JP2015/059126 on Mar. 25, 2015, now Pat. No. 9,659,865.

(51) Int. Cl.
  *H01L 23/522* (2006.01)
  *H01L 23/532* (2006.01)
  *H01L 29/06* (2006.01)
  *H01L 29/423* (2006.01)
  *H01L 29/78* (2006.01)
  *H01L 23/528* (2006.01)
  *H01L 29/417* (2006.01)
  *H01L 29/66* (2006.01)

(52) U.S. Cl.
  CPC .... *H01L 23/5222* (2013.01); *H01L 23/53295* (2013.01); *H01L 29/0649* (2013.01); *H01L 29/41758* (2013.01); *H01L 29/4238* (2013.01); *H01L 29/66568* (2013.01); *H01L 29/78* (2013.01); *H01L 2924/0002* (2013.01)

(58) Field of Classification Search
  USPC ......... 257/774, 760, E23.011, E23.145, 522, 257/E21.581, 762, E21.585
  See application file for complete search history.

(56) References Cited

U.S. PATENT DOCUMENTS

| | | | | |
|---|---|---|---|---|
| 2006/0051958 | A1* | 3/2006 | Ho | H01L 21/7681 438/638 |
| 2006/0183317 | A1* | 8/2006 | Noguchi | H01L 21/76801 438/629 |
| 2014/0264896 | A1* | 9/2014 | Lu | H01L 23/5222 257/773 |

FOREIGN PATENT DOCUMENTS

| | | |
|---|---|---|
| JP | 06-252161 A | 9/1994 |
| JP | 11-126820 | 6/1999 |
| JP | 2000-156494 A | 6/2000 |
| JP | 2001-085519 A | 3/2001 |
| JP | 2002050767 A | 2/2002 |
| JP | 2002-110700 A | 4/2002 |
| JP | 2002-217285 A | 8/2002 |
| JP | 2002-359369 A | 12/2002 |
| JP | 2003023075 A | 1/2003 |
| JP | 2003-163266 A | 6/2003 |
| JP | 2005-136152 A | 5/2005 |
| JP | 2006-511955 A | 4/2006 |
| JP | 2009-021269 A | 1/2009 |
| JP | 2009-219023 A | 9/2009 |
| JP | 2009-267347 A | 11/2009 |
| JP | 2009-295733 A | 12/2009 |
| JP | 2013-048390 A | 3/2013 |
| WO | WO-2014/011510 A2 | 1/2014 |

OTHER PUBLICATIONS

C.-H. Jan, U. et al. "A 22nm SoC Platform Technology Featuring 3-D Tri-Gate and High-k/Metal Gate, Optimized for Ultra Low Power, High Performance and High Density SoC Applications" Logic Technology Development, Intel Corporation, Hillsboro, Oregon, USA, IEEE International Electron Devices Meeting—Dec. 2012.

Chinese Office Action dated Oct. 25, 2018 for corresponding Chinese Application No. 201580000970.4.

Japanese Office Action dated Nov. 13, 2018 for corresponding Japanese Application No. 2018-026610.

* cited by examiner

[ FIG. 1 ]
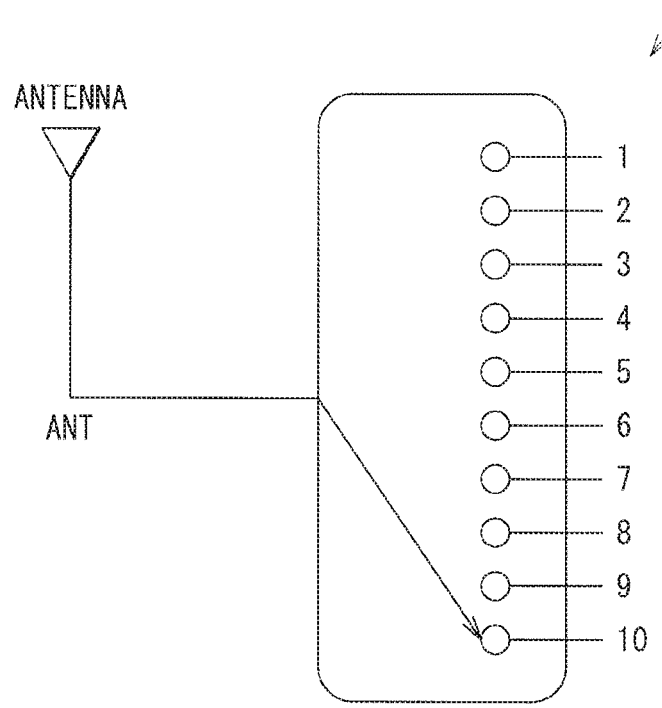
[ FIG. 2 ]
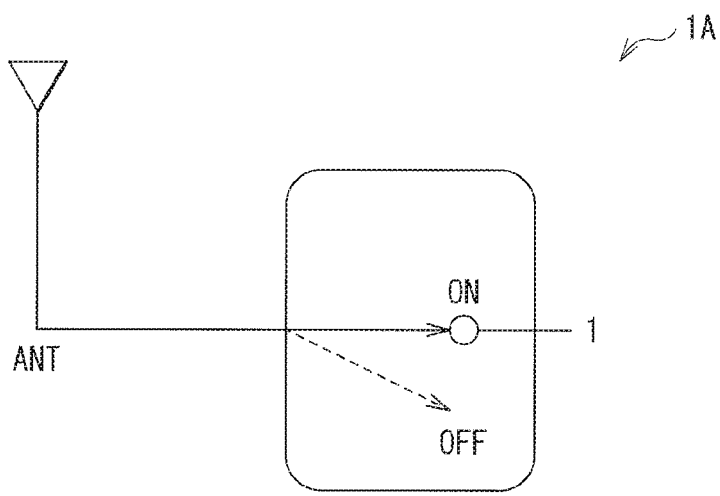

[ FIG. 3 ]
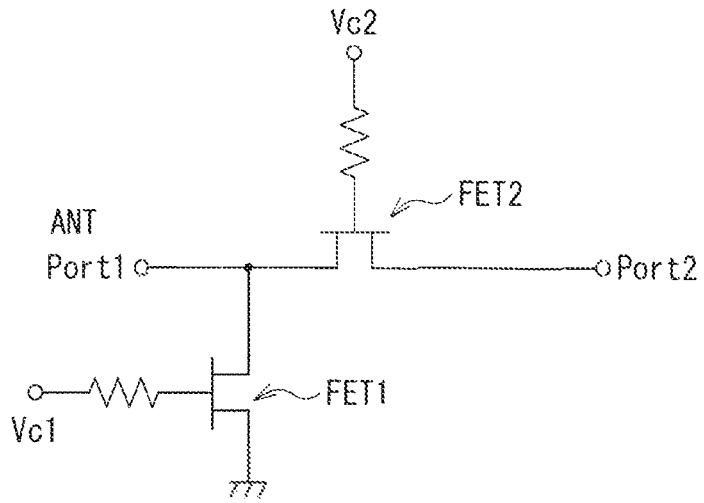
[ FIG. 4 ]
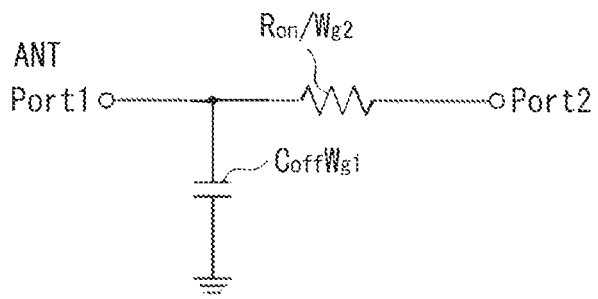
[ FIG. 5 ]
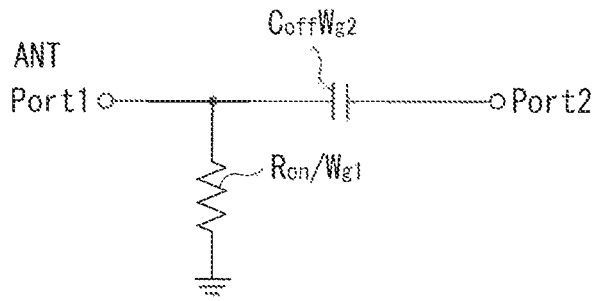

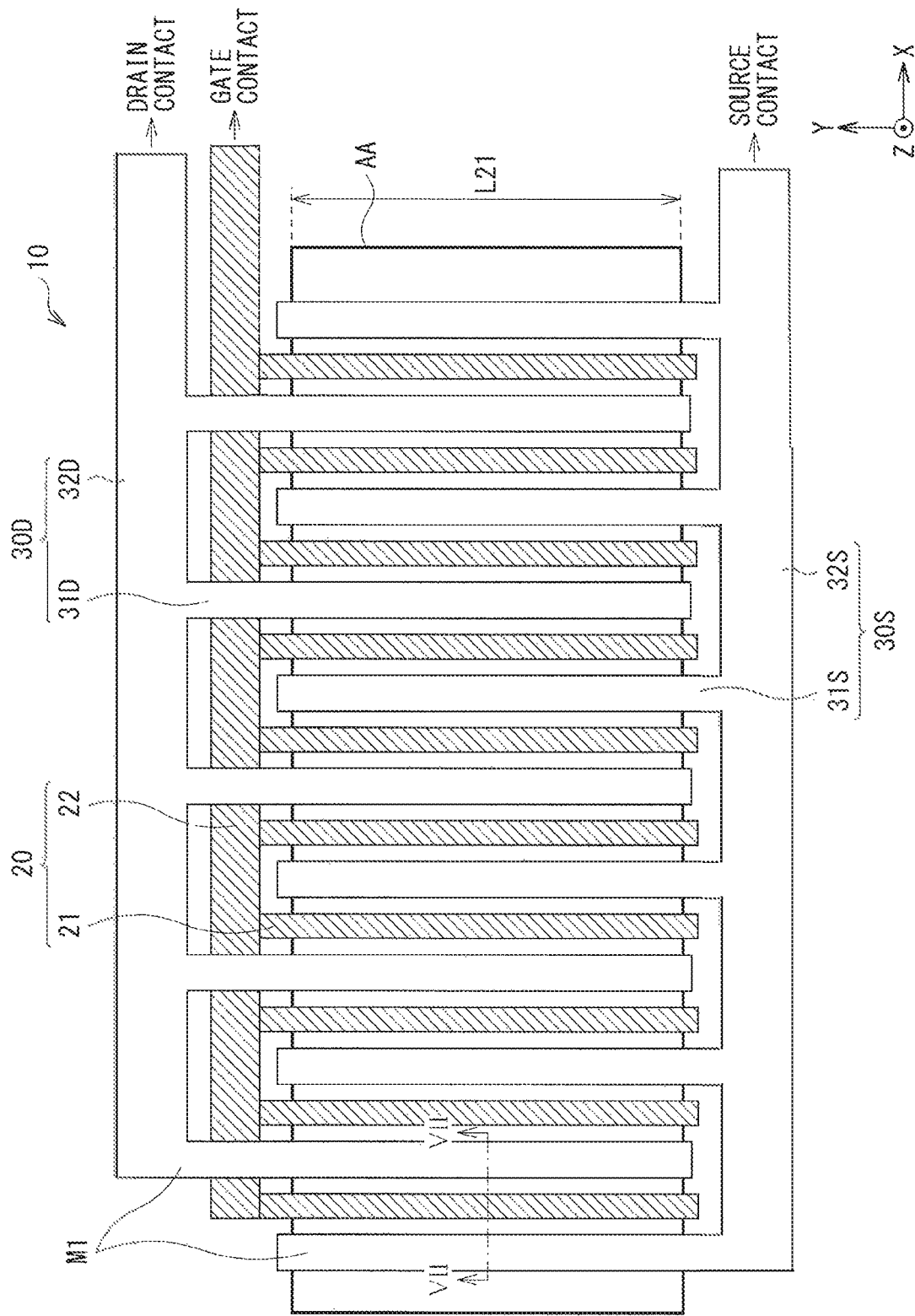

[ FIG. 7 ]
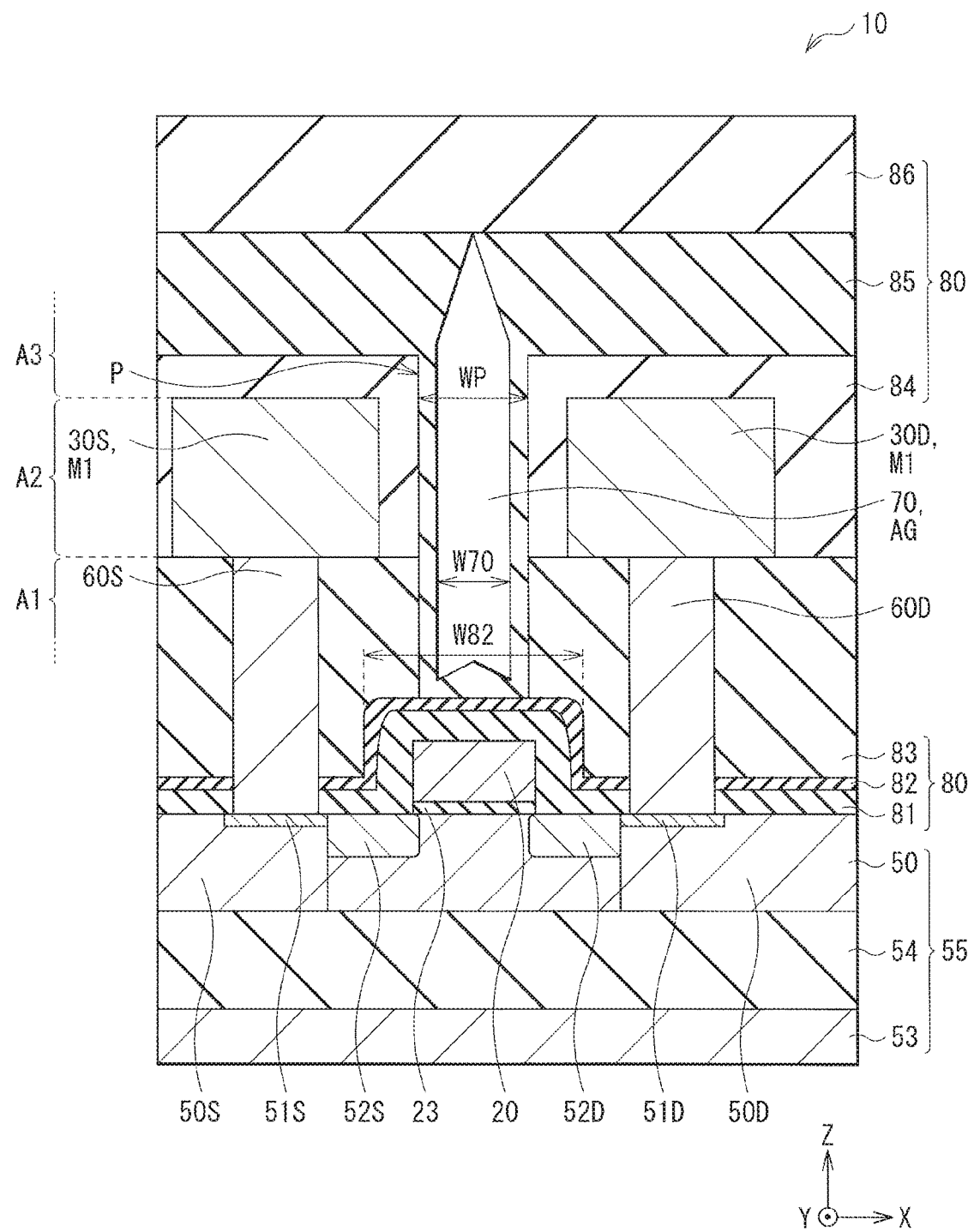

[ FIG. 8 ]
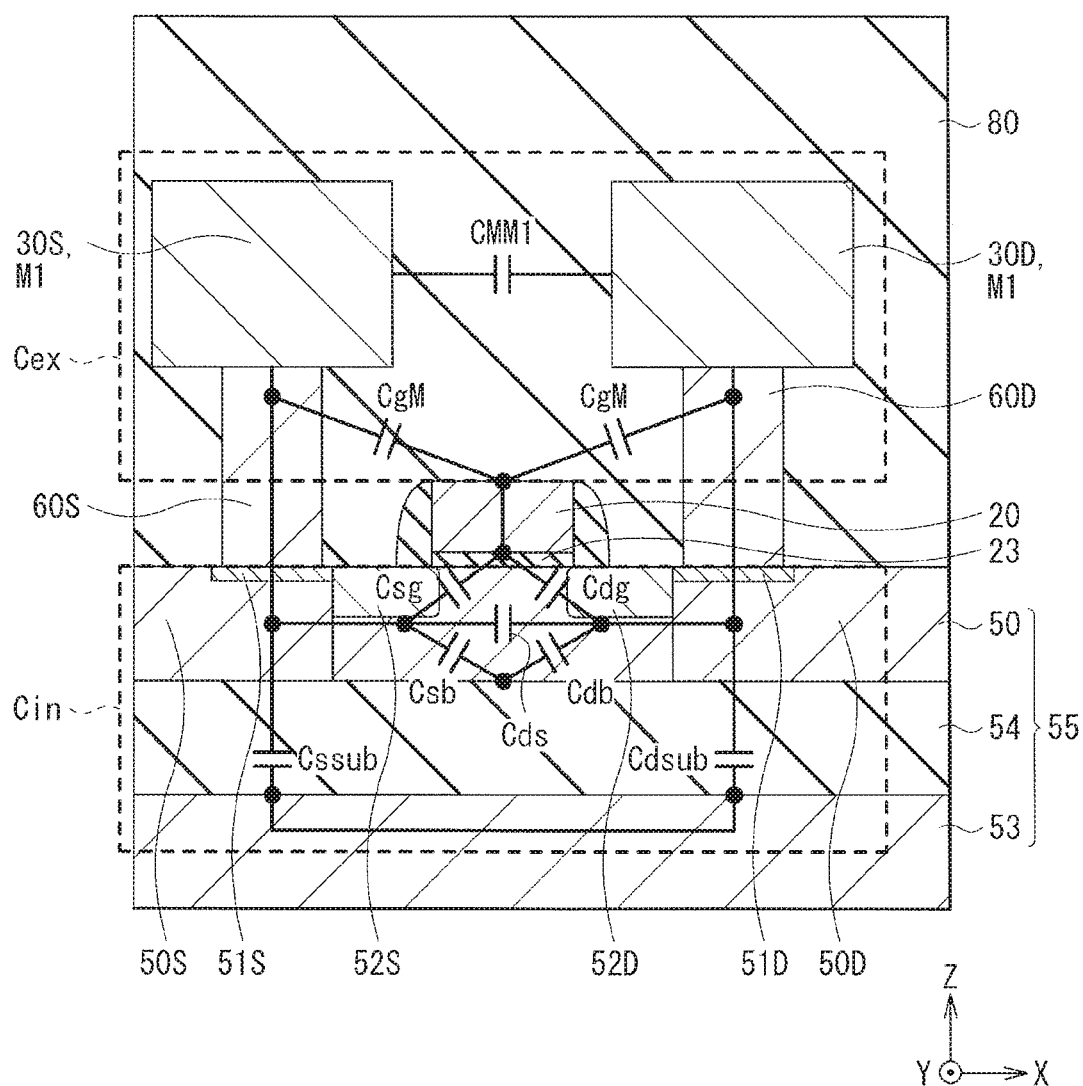

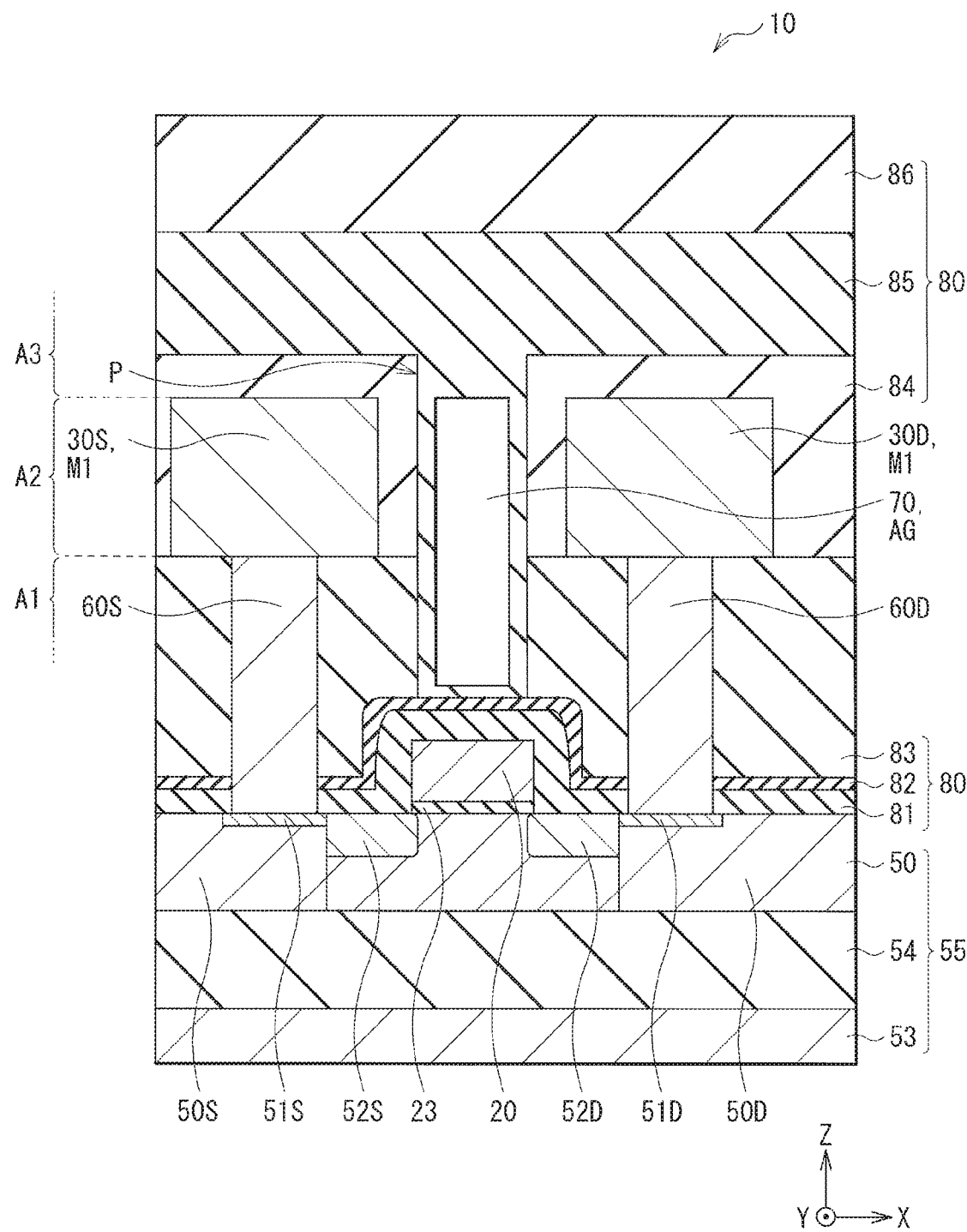
[ FIG. 9 ]

[ FIG. 10 ]
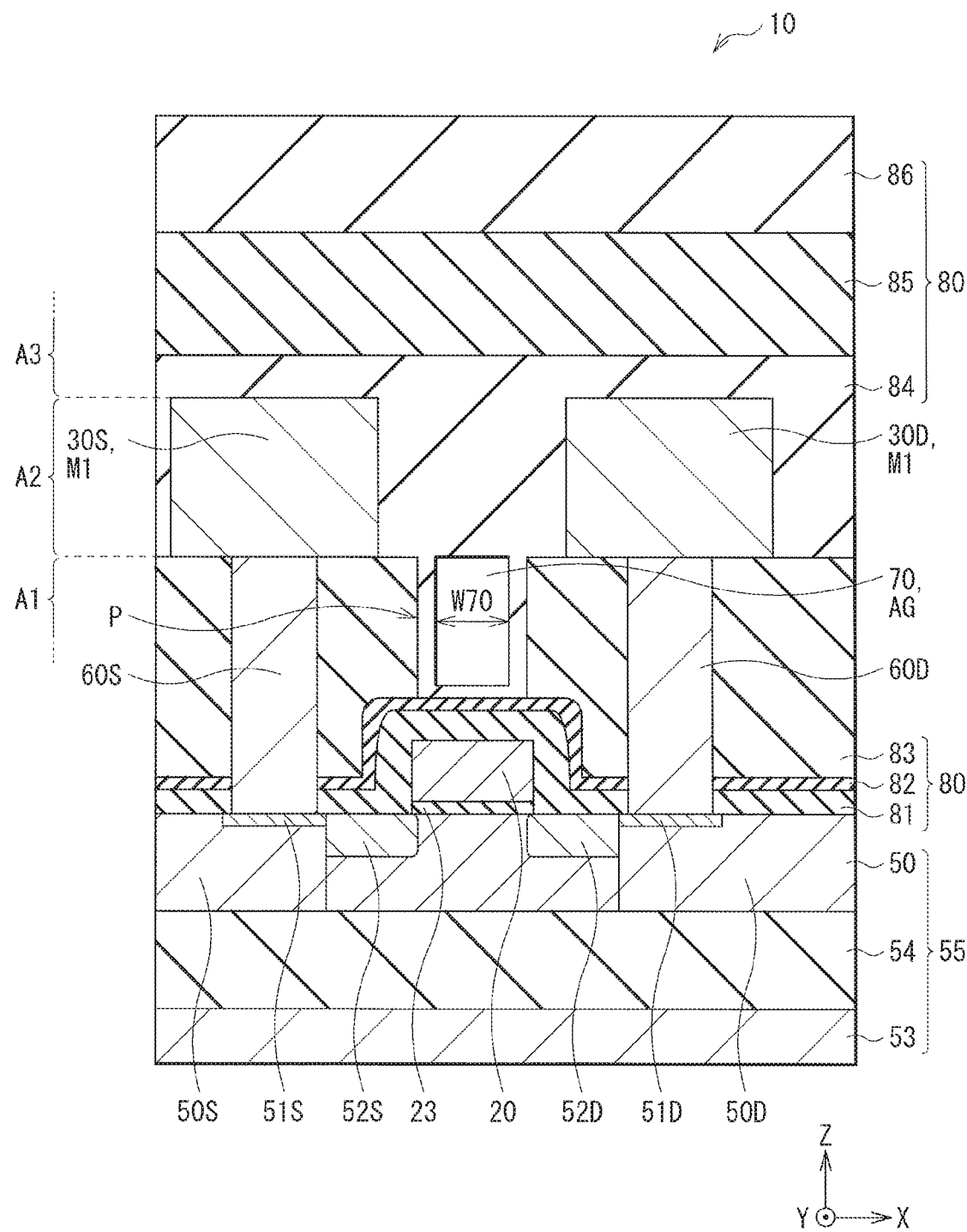

[ FIG. 11 ]
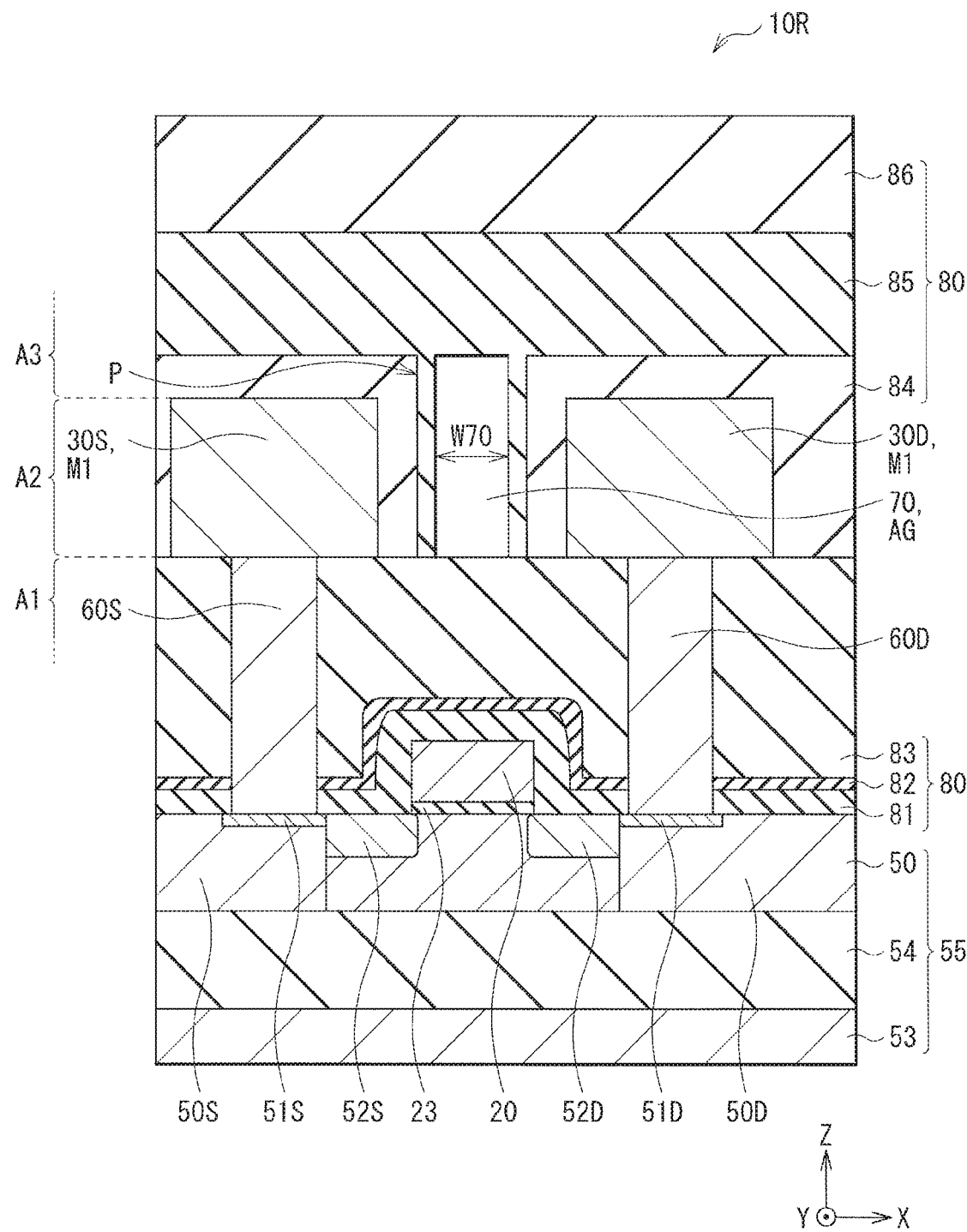

[ FIG. 12 ]
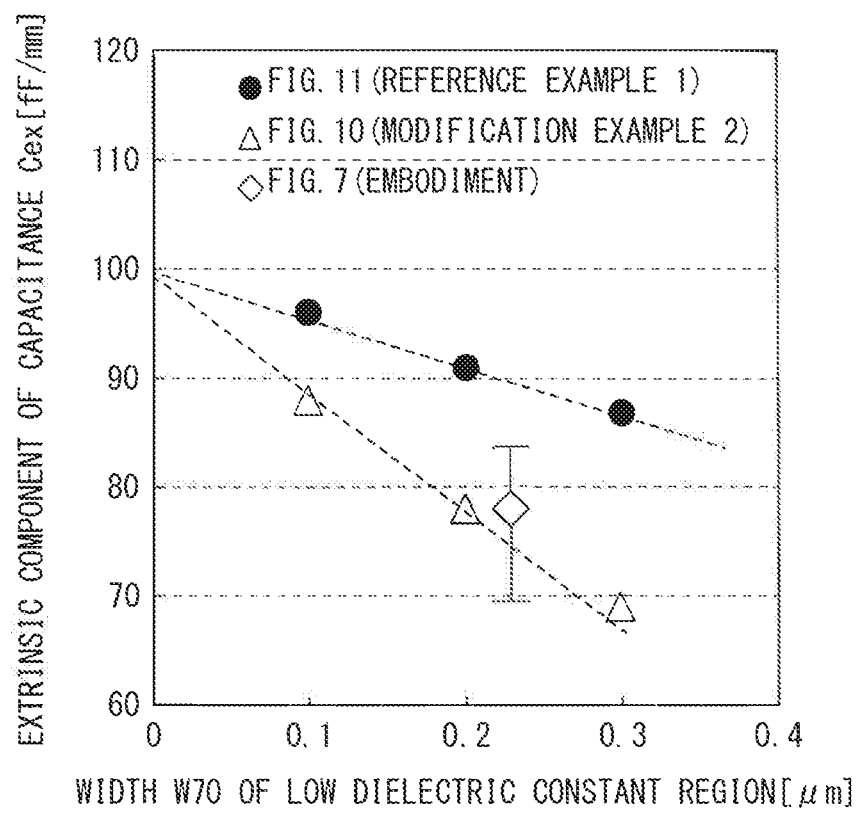

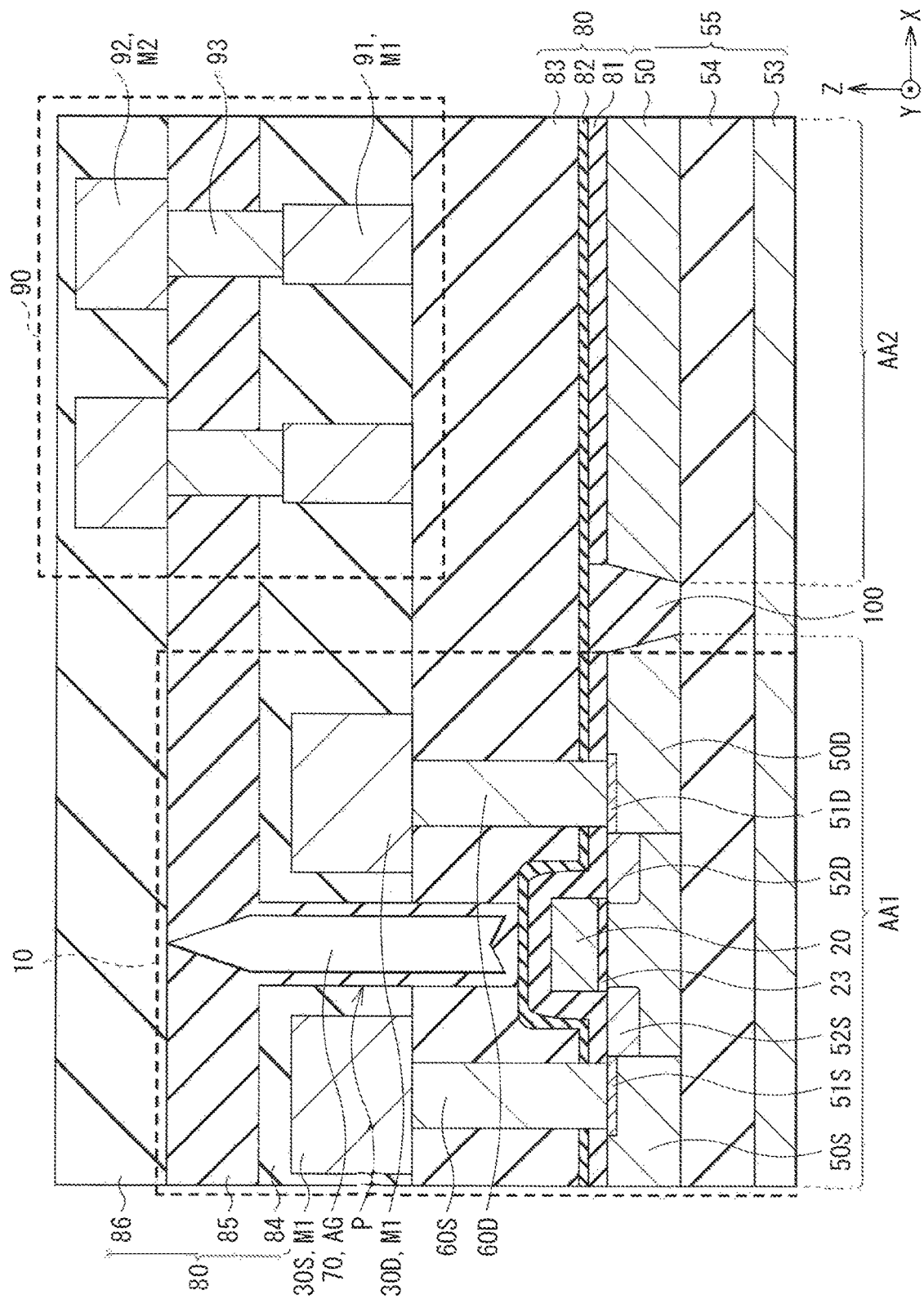

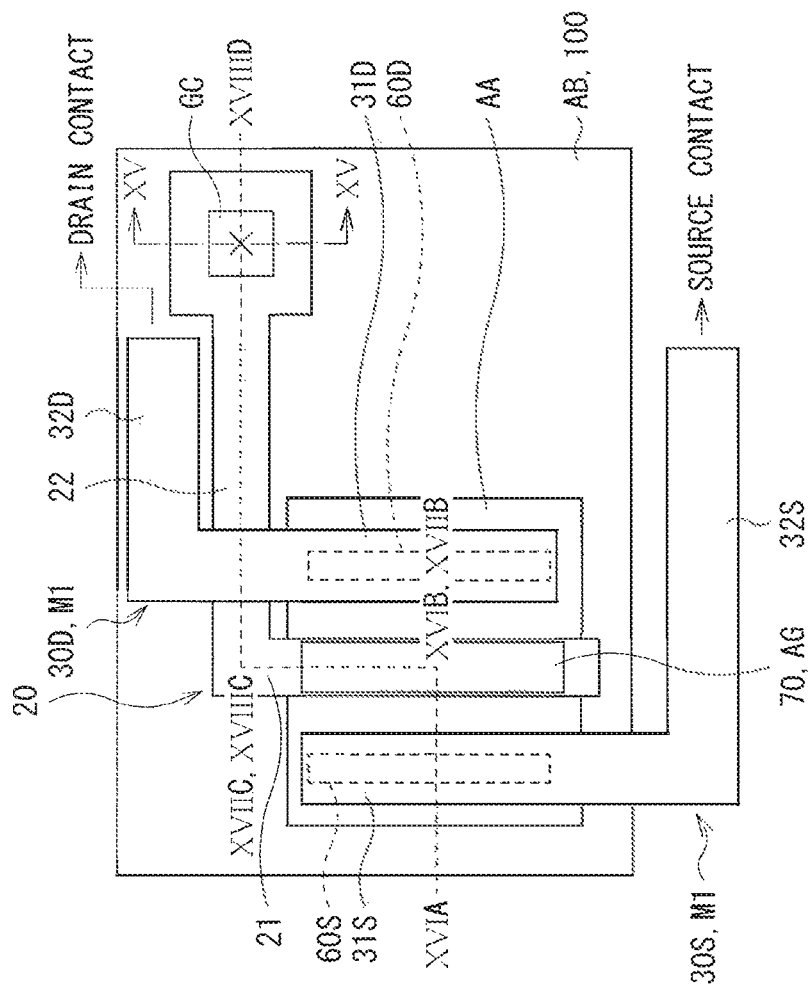

[FIG. 15]
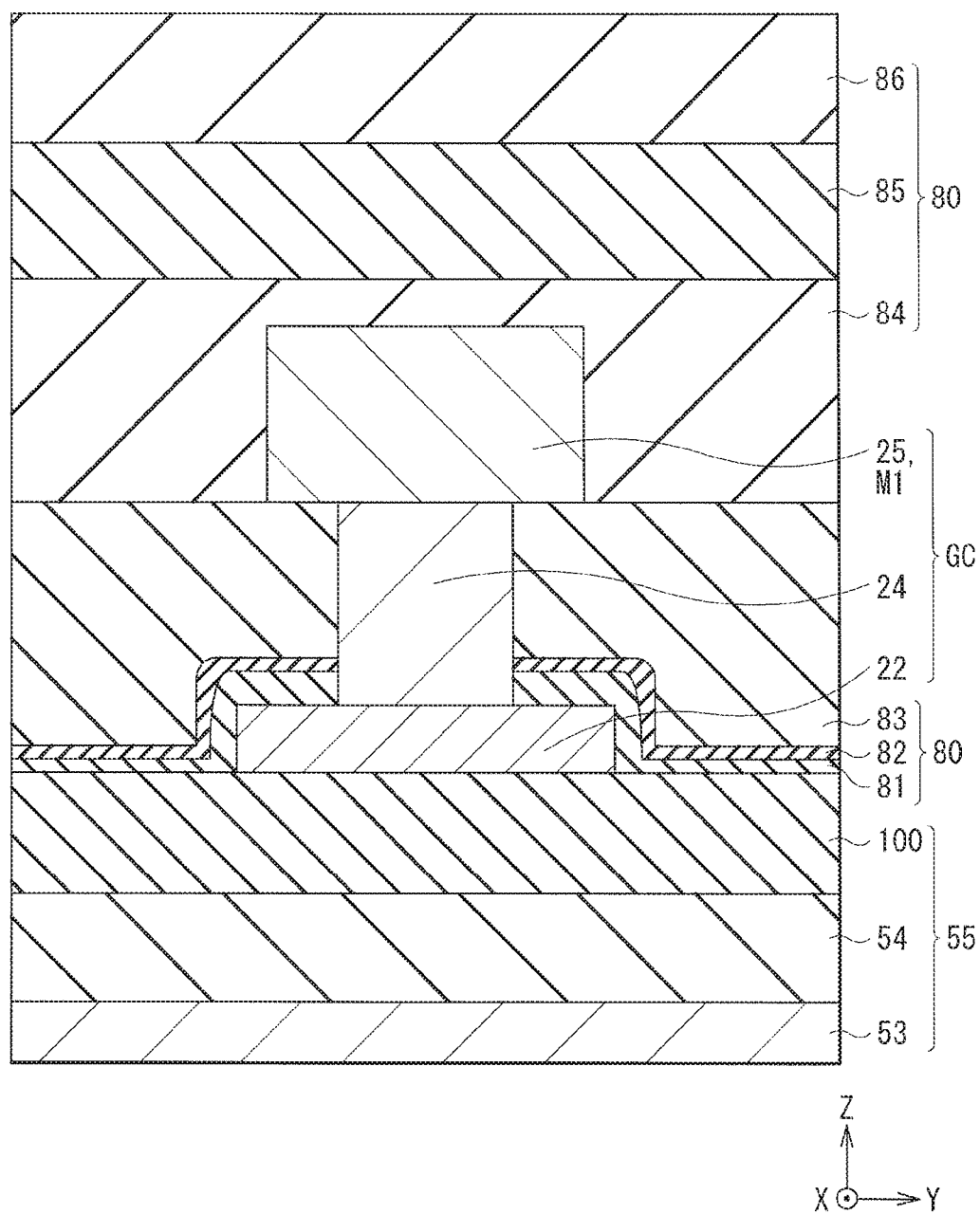

[FIG. 16]
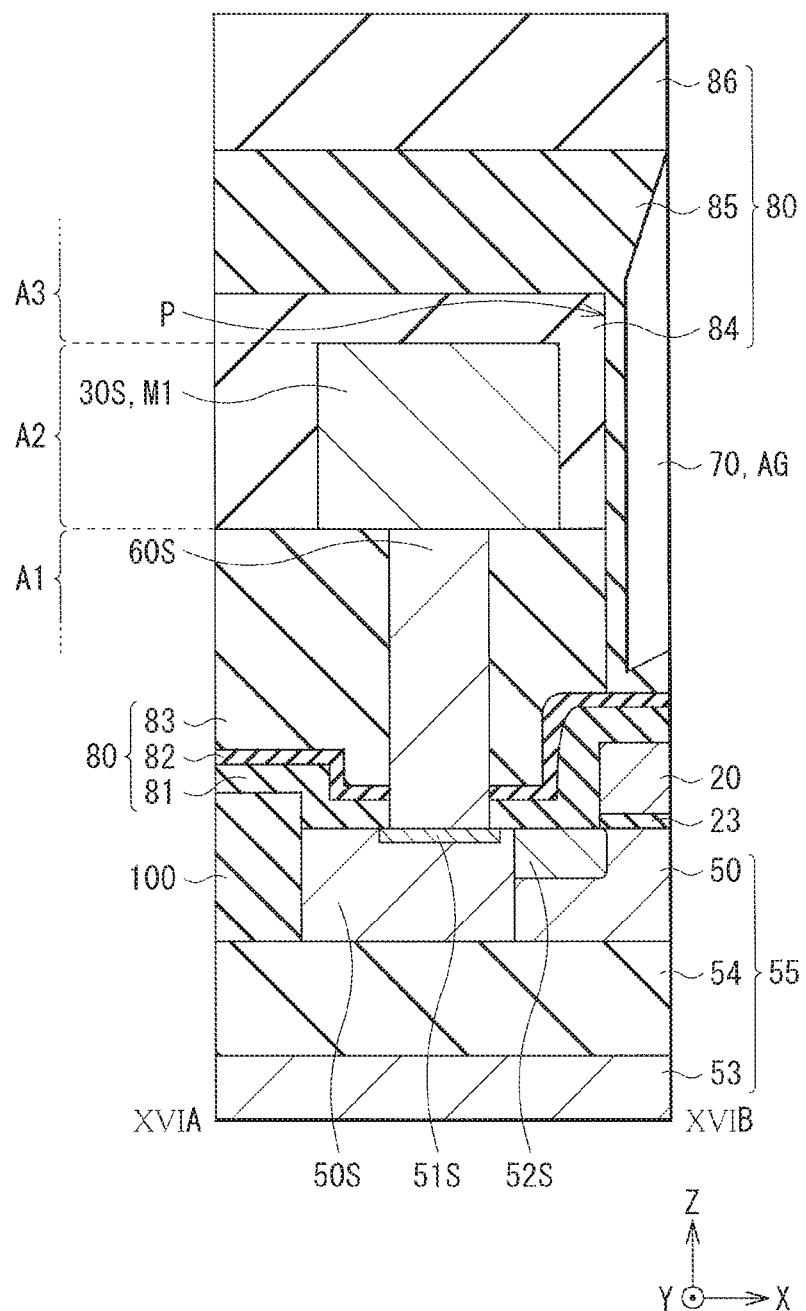

[ FIG. 17 ]
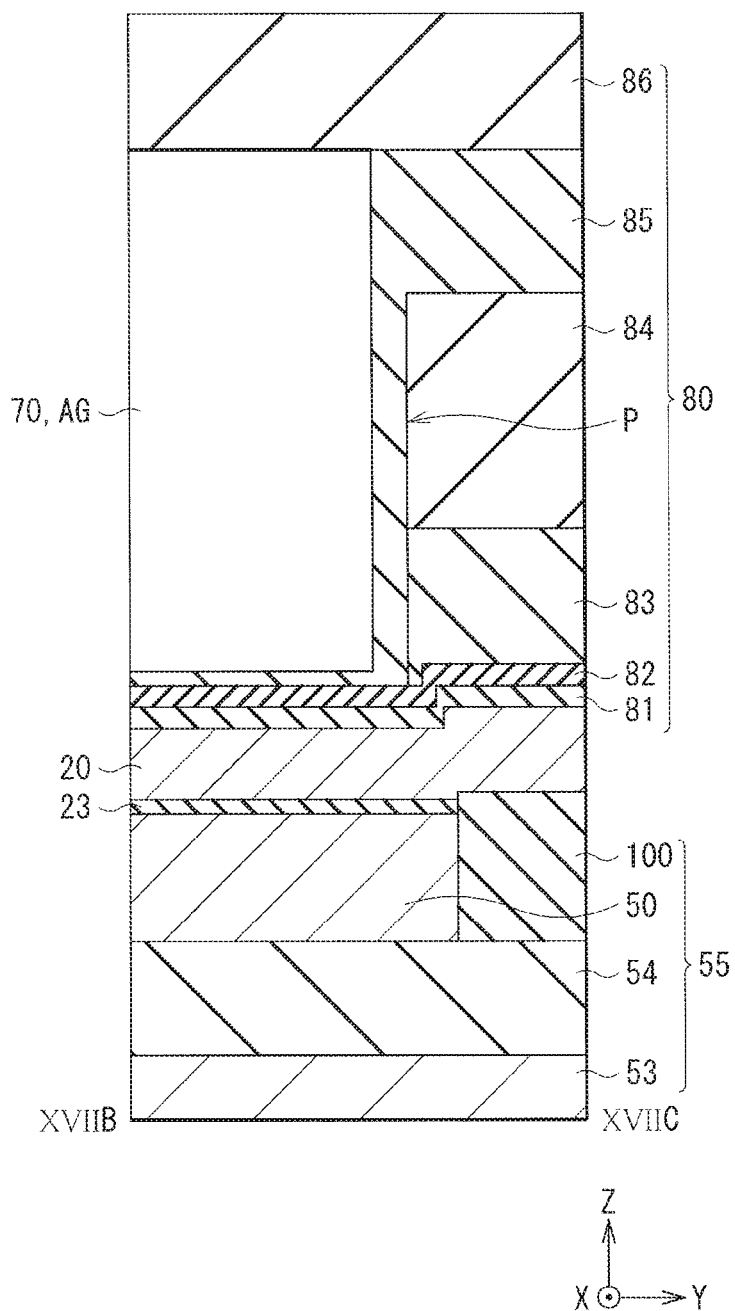

[FIG. 18]
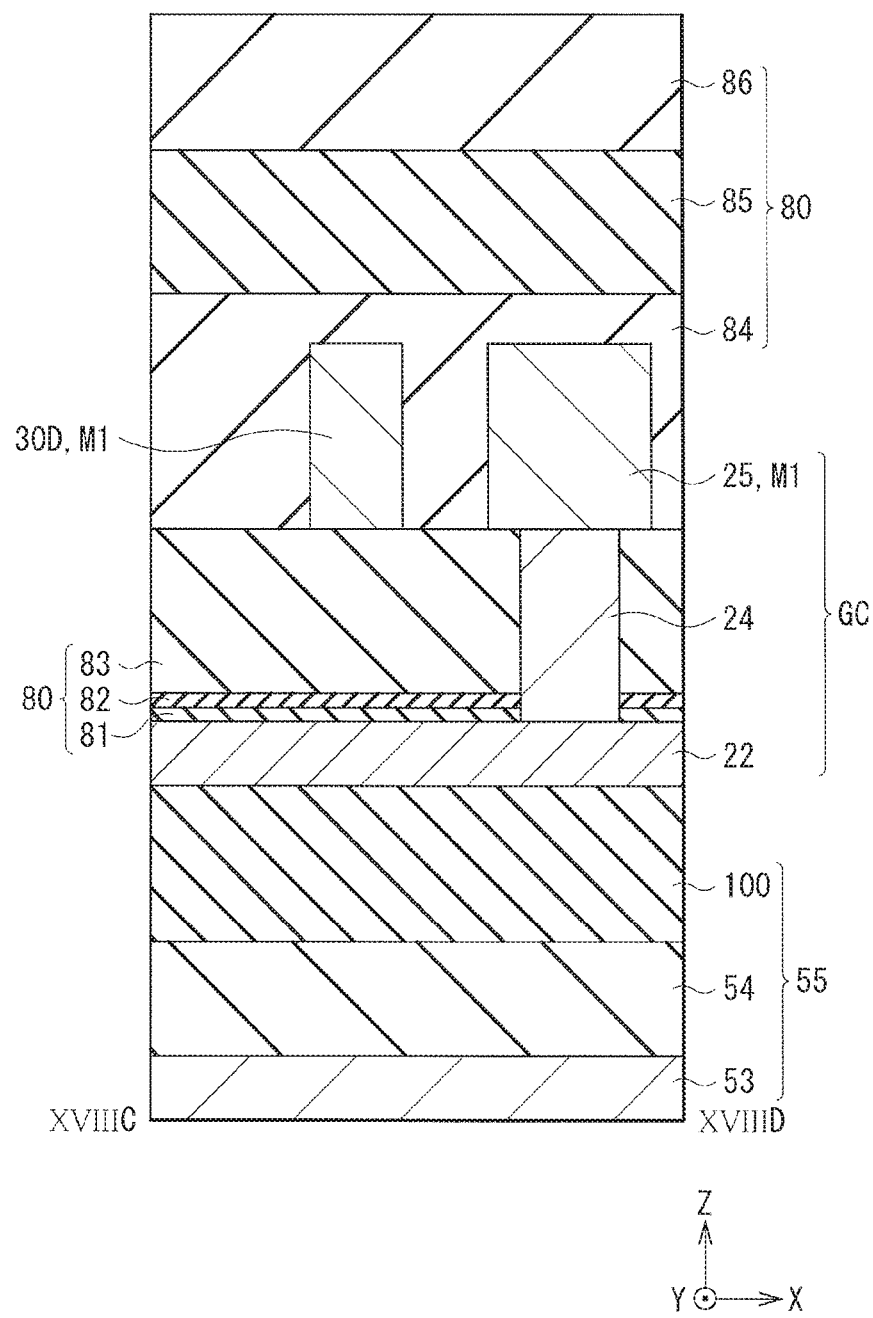

[ FIG. 19 ]
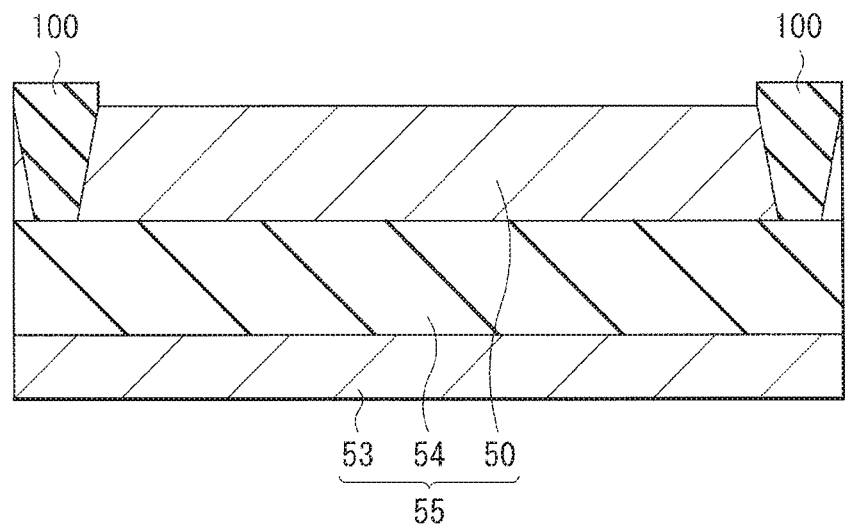
[ FIG. 20 ]
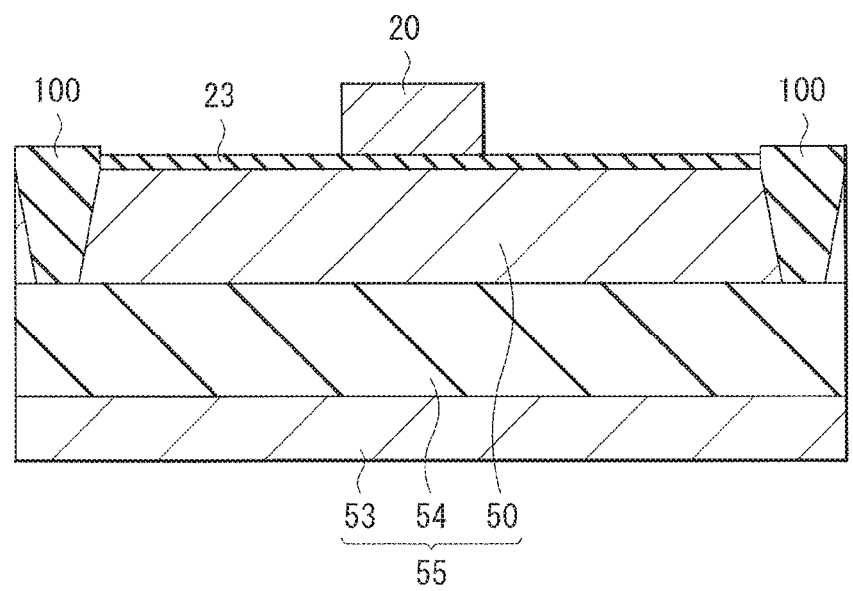

[ FIG. 21 ]
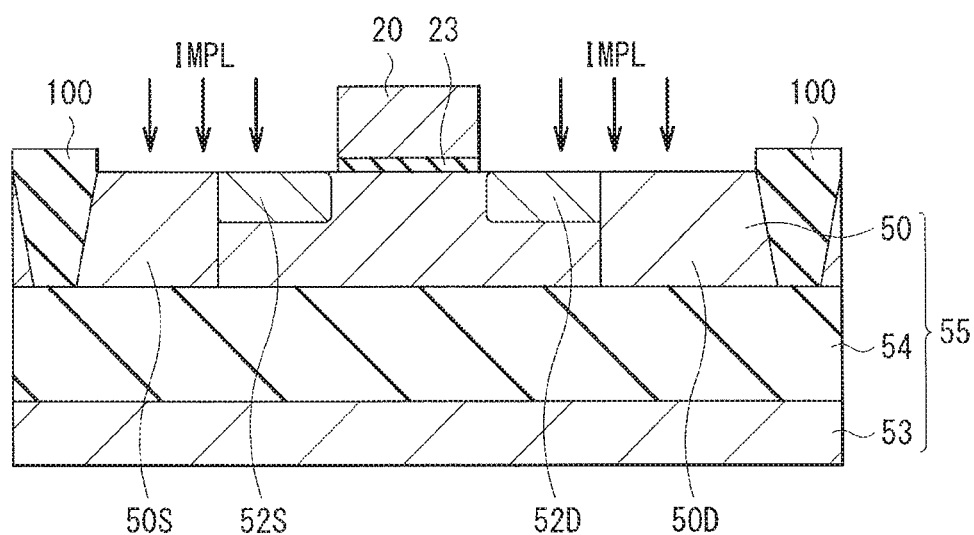
[ FIG. 22 ]
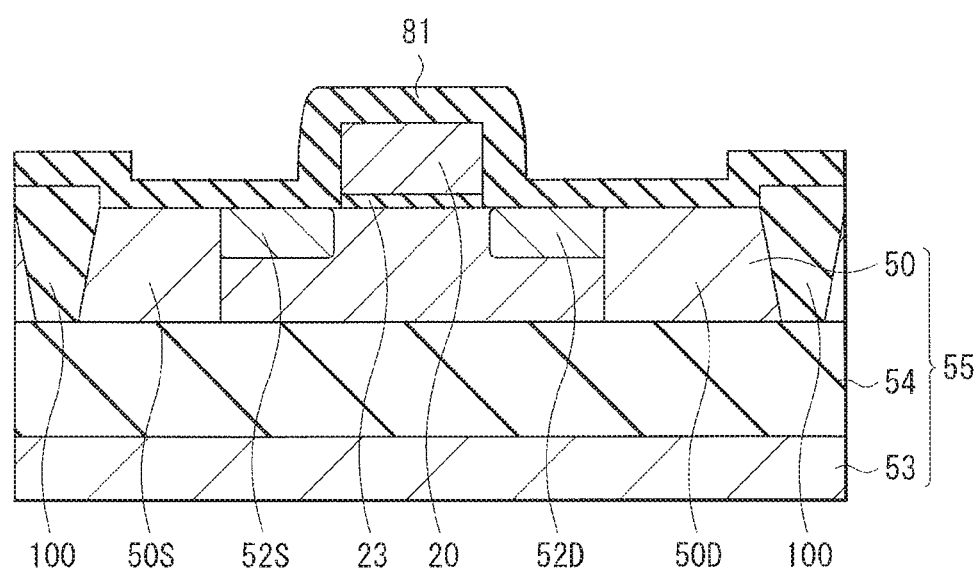

[ FIG. 23 ]
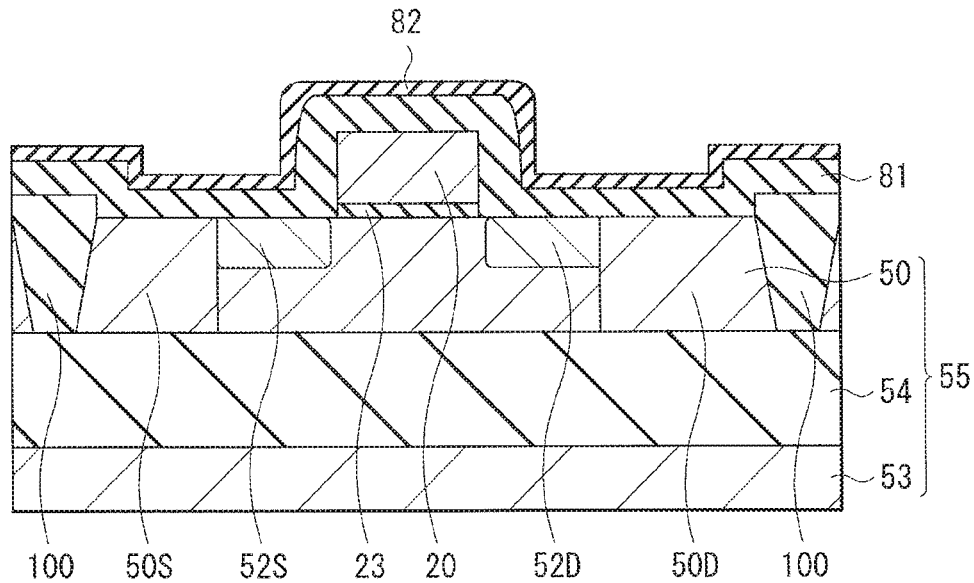
[ FIG. 24 ]
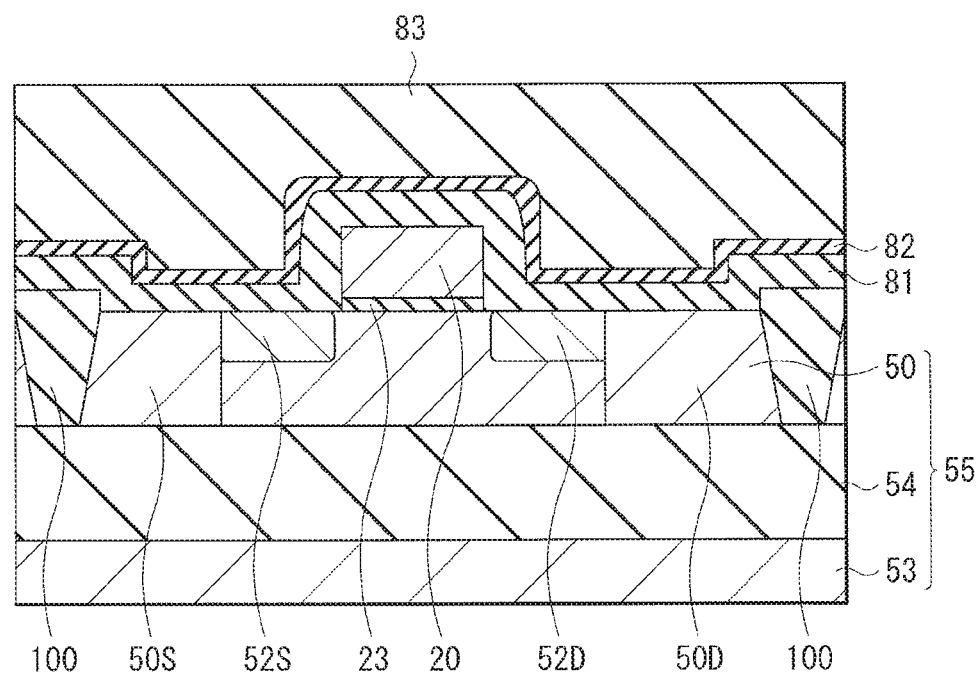

[ FIG. 25 ]
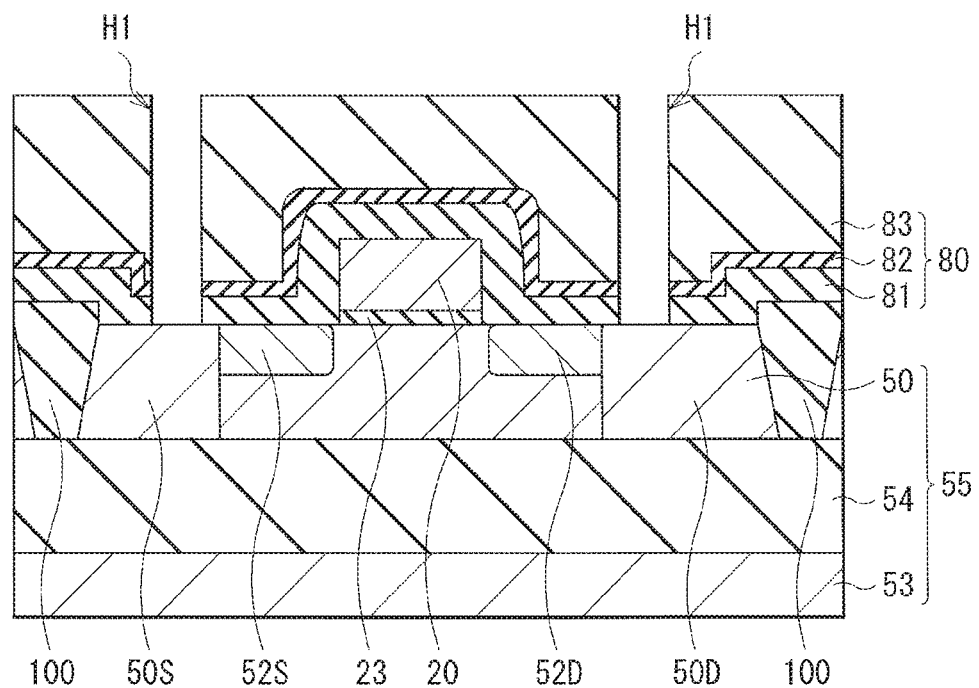

[ FIG. 26 ]
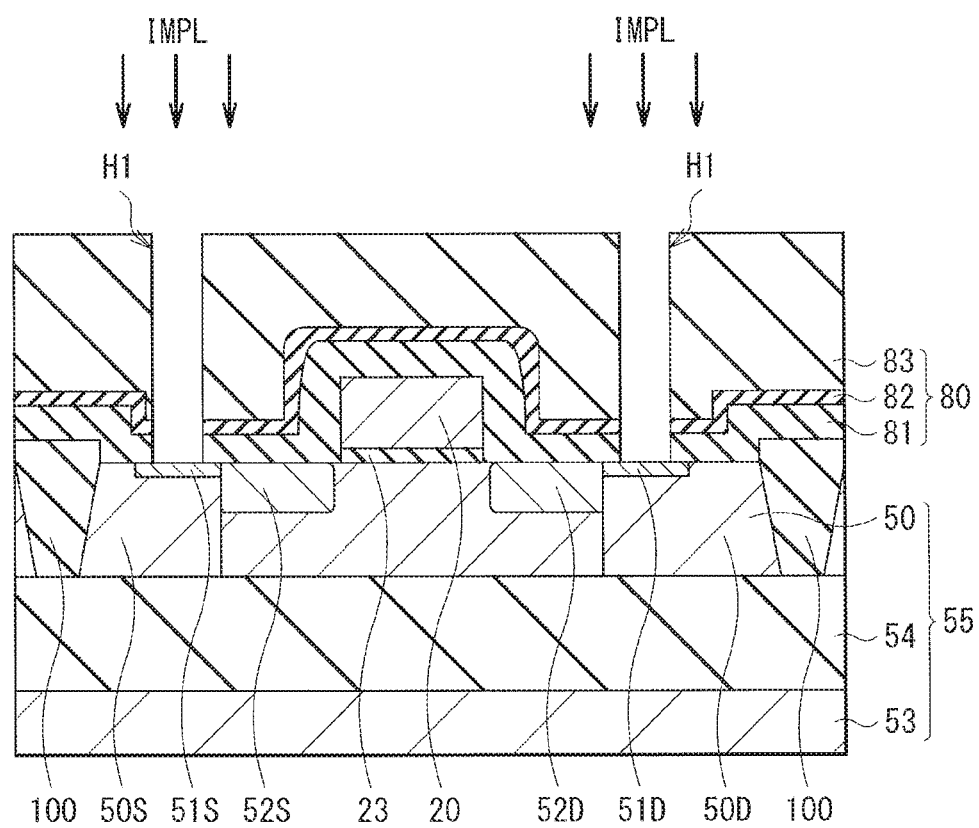

[FIG. 27]
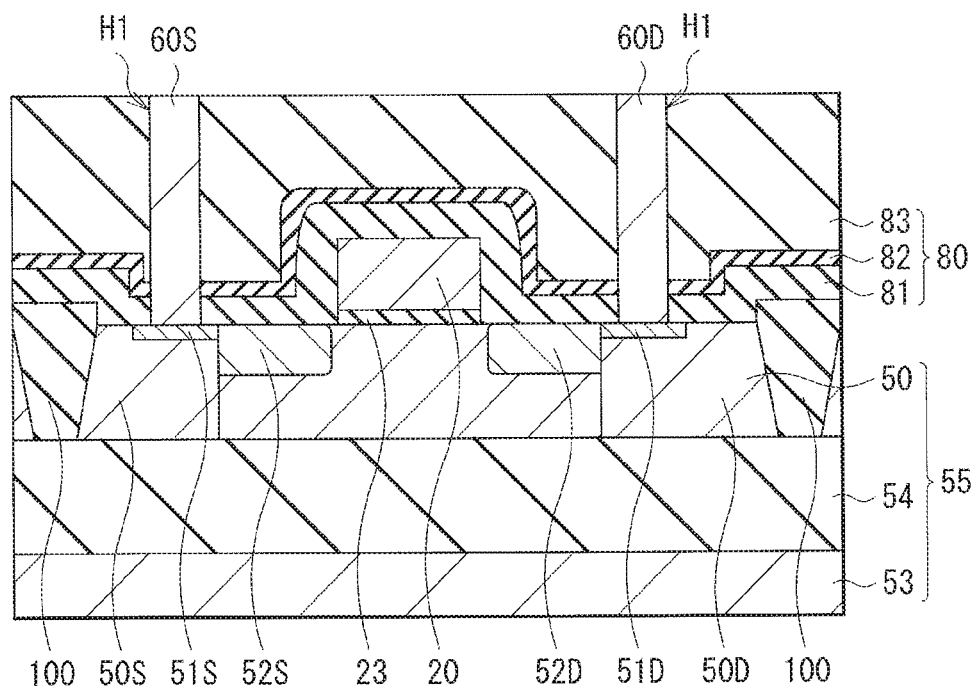

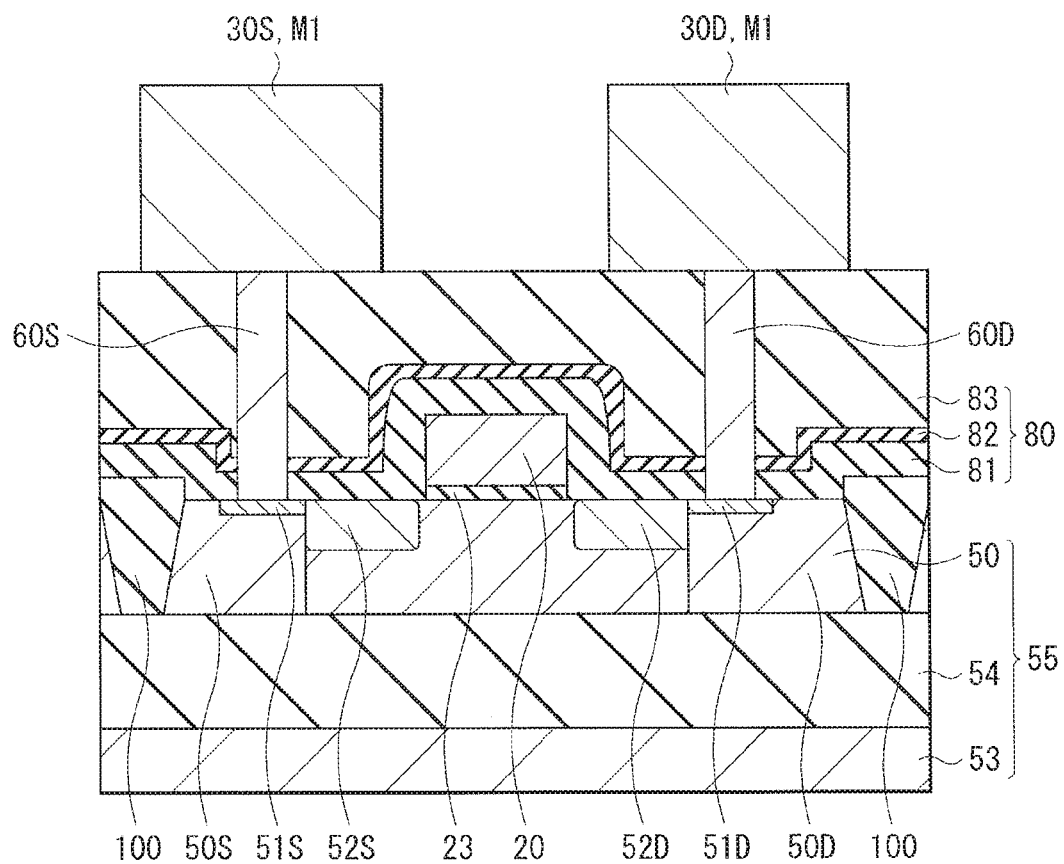
[FIG. 28]

[ FIG. 29 ]
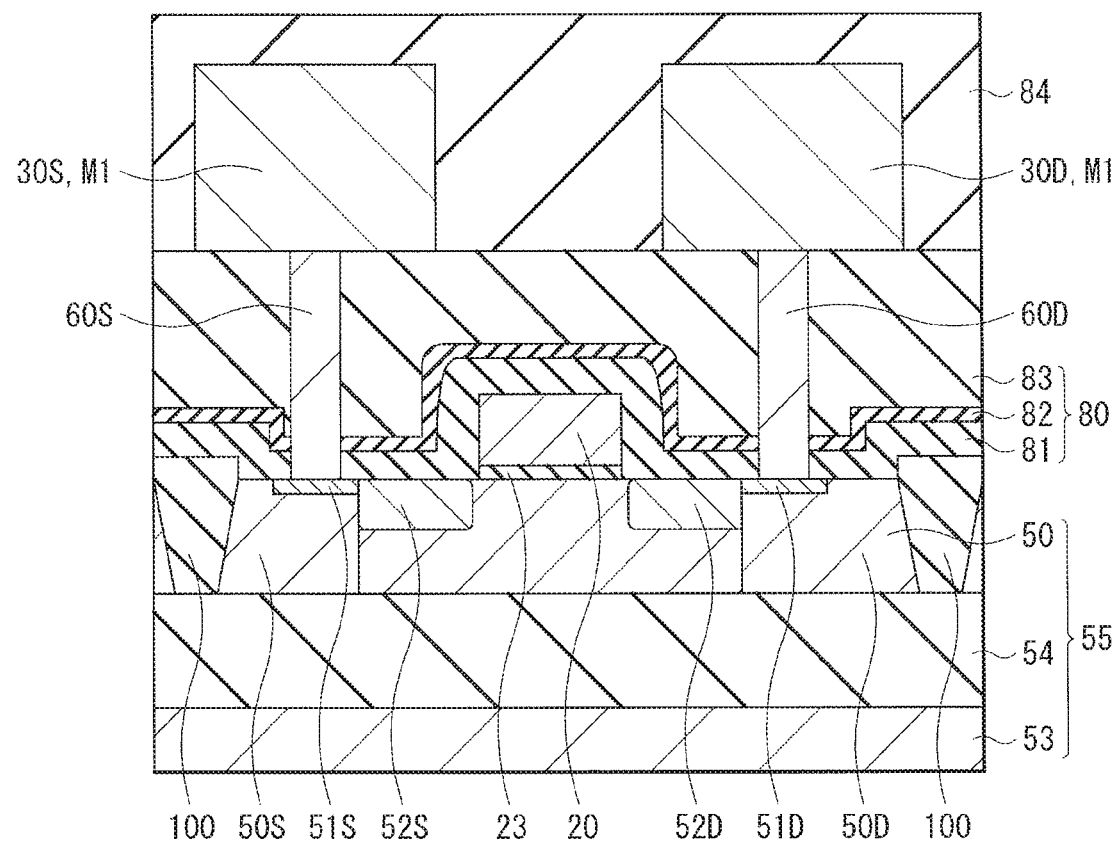

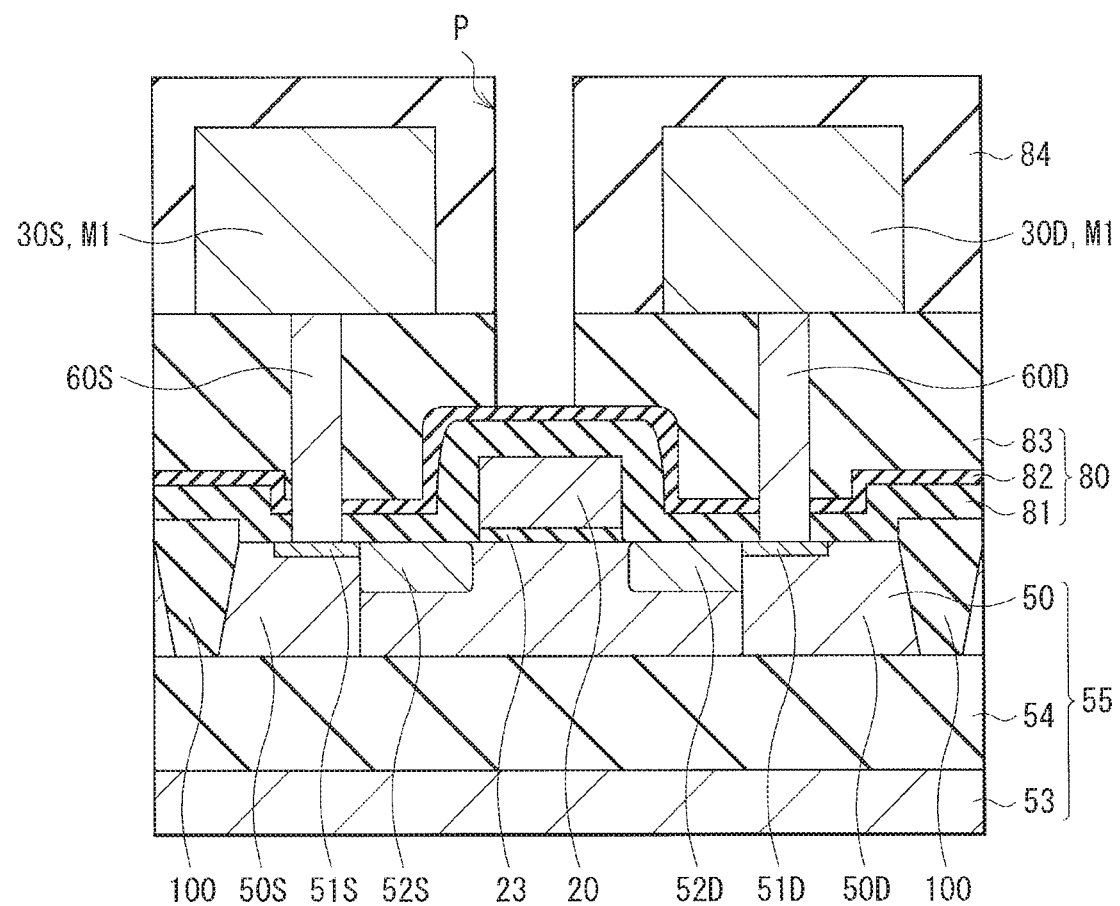
[FIG. 30]

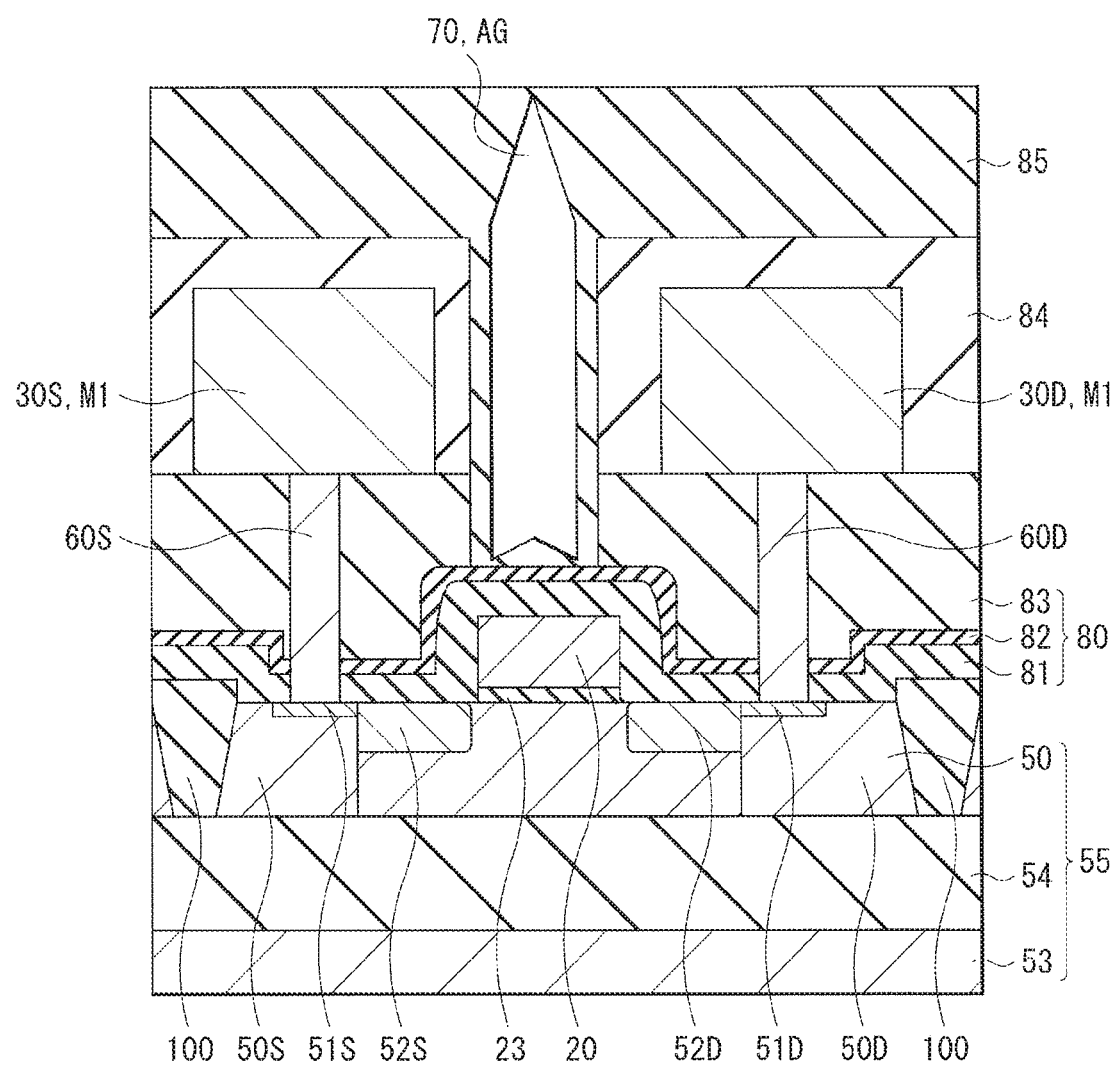
[FIG. 31]

[FIG. 32]
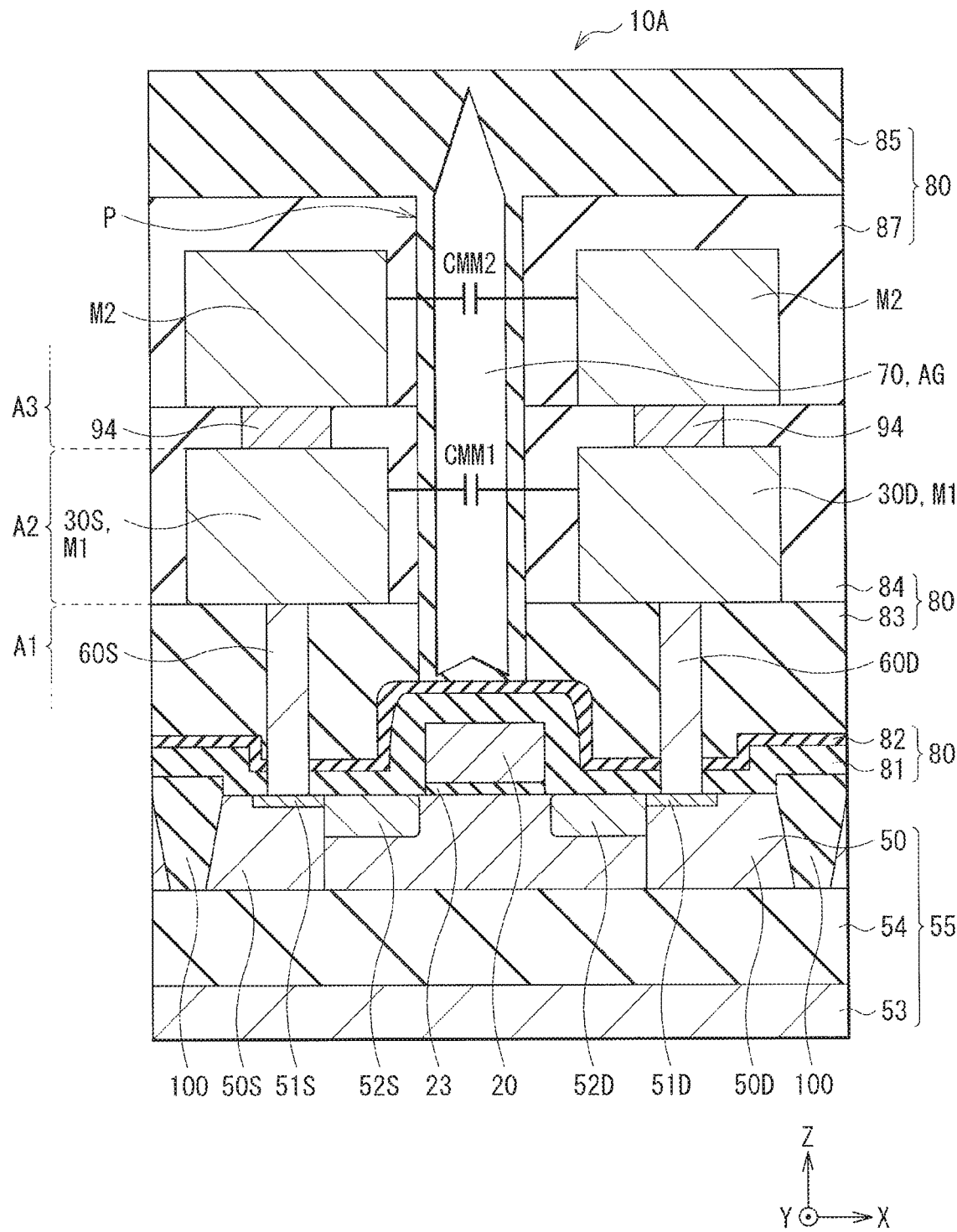

[ FIG. 33 ]
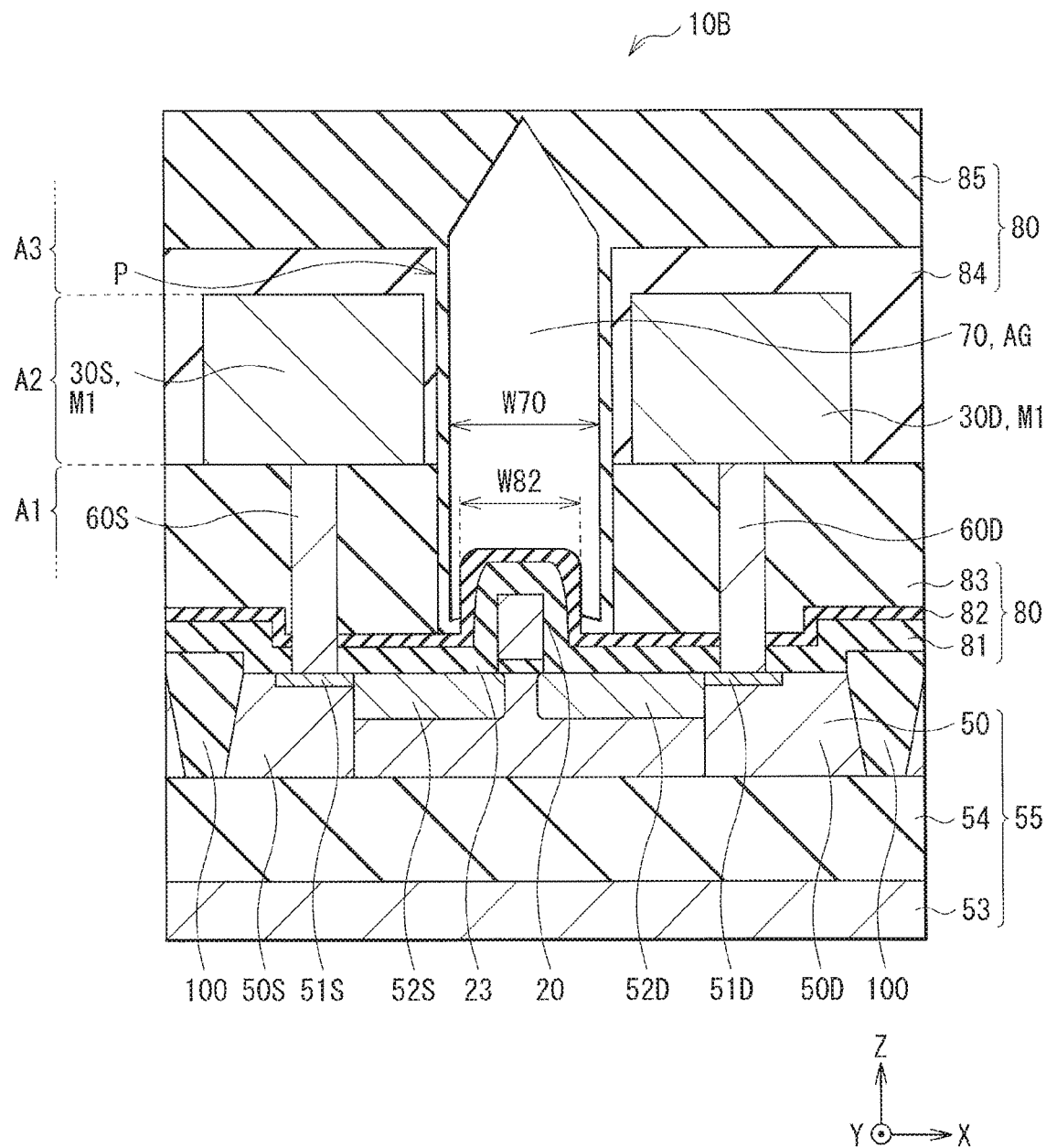

[FIG. 34]
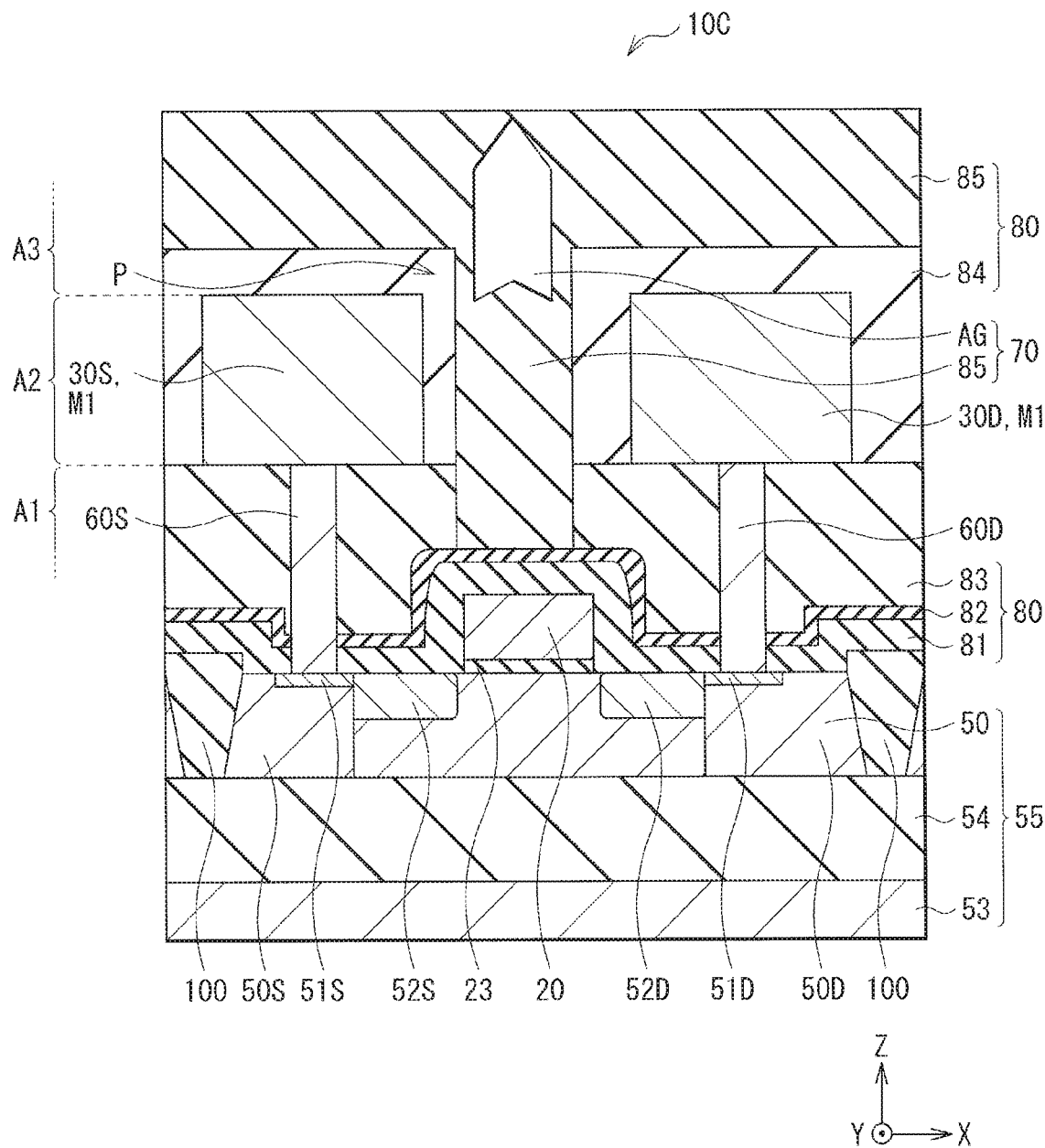

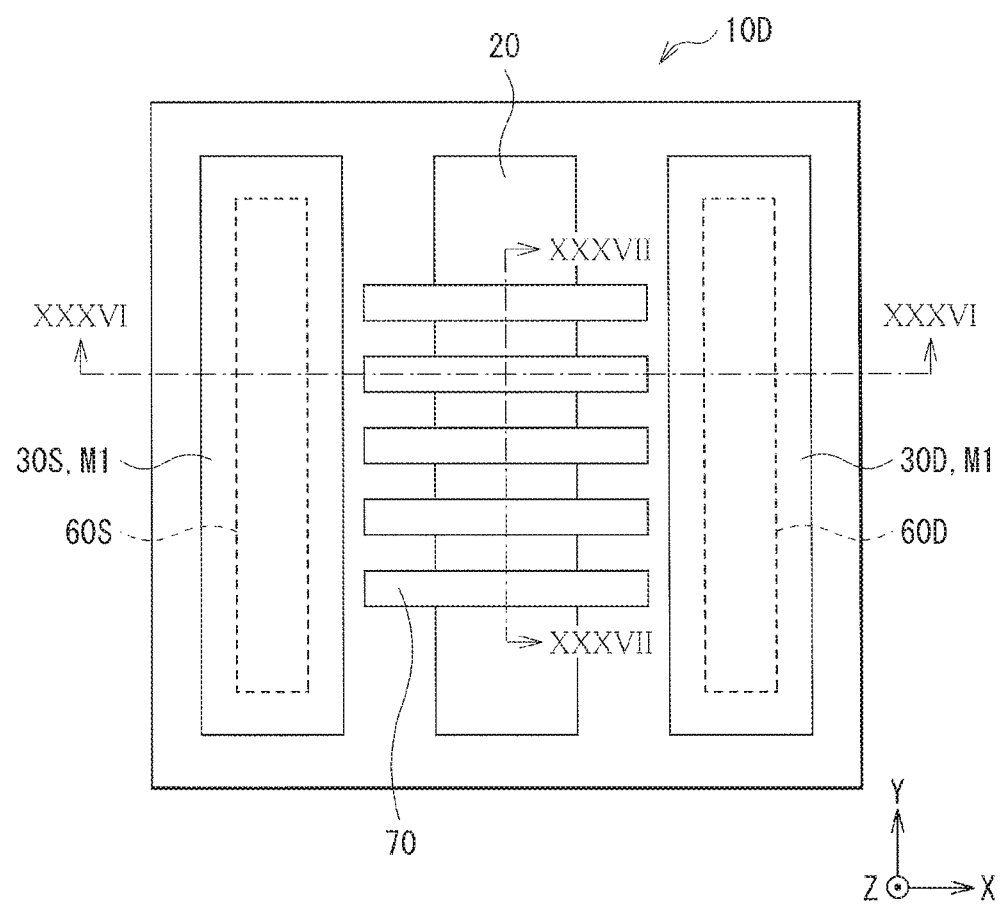
[ FIG. 35 ]

[ FIG. 36 ]
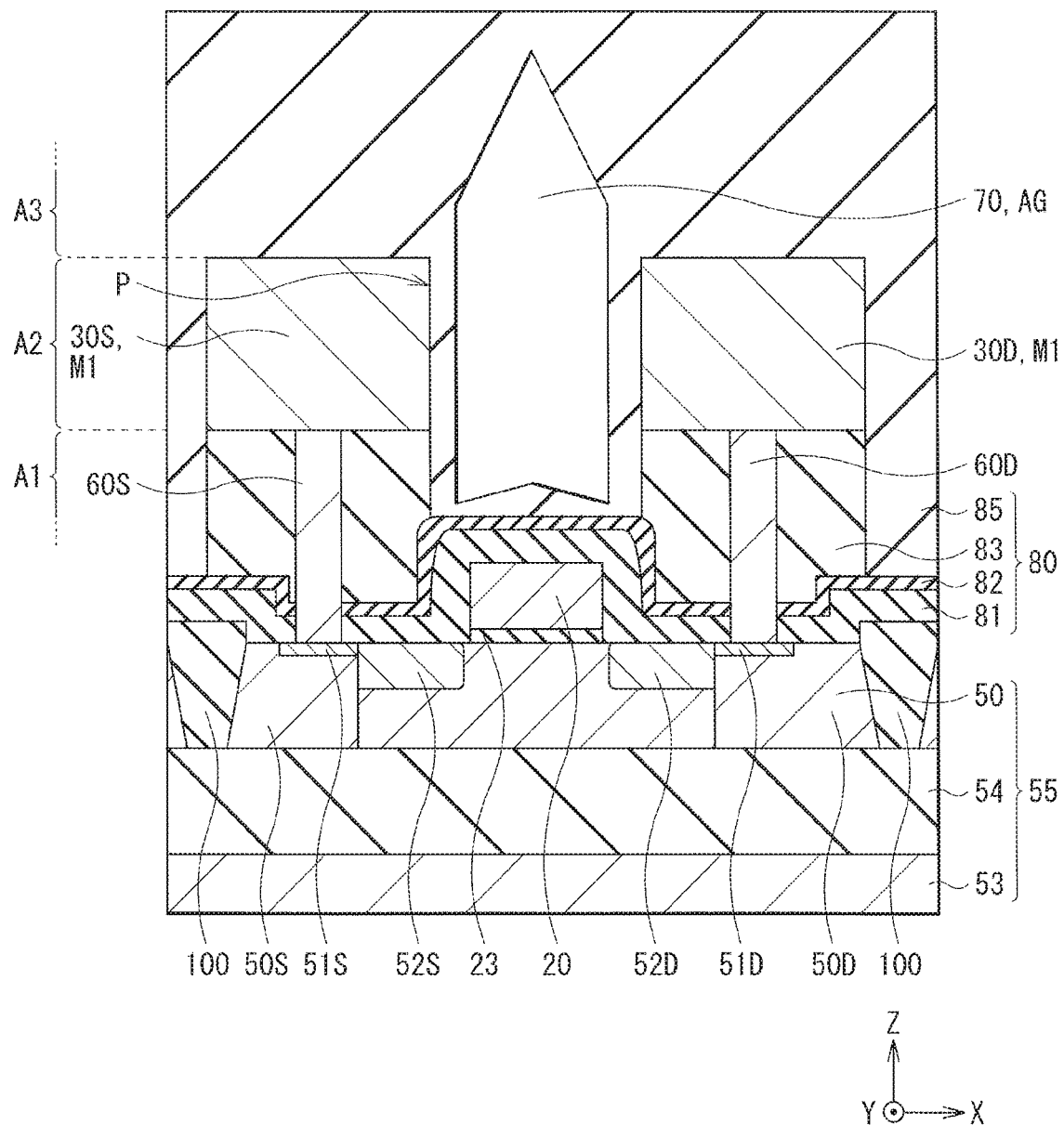

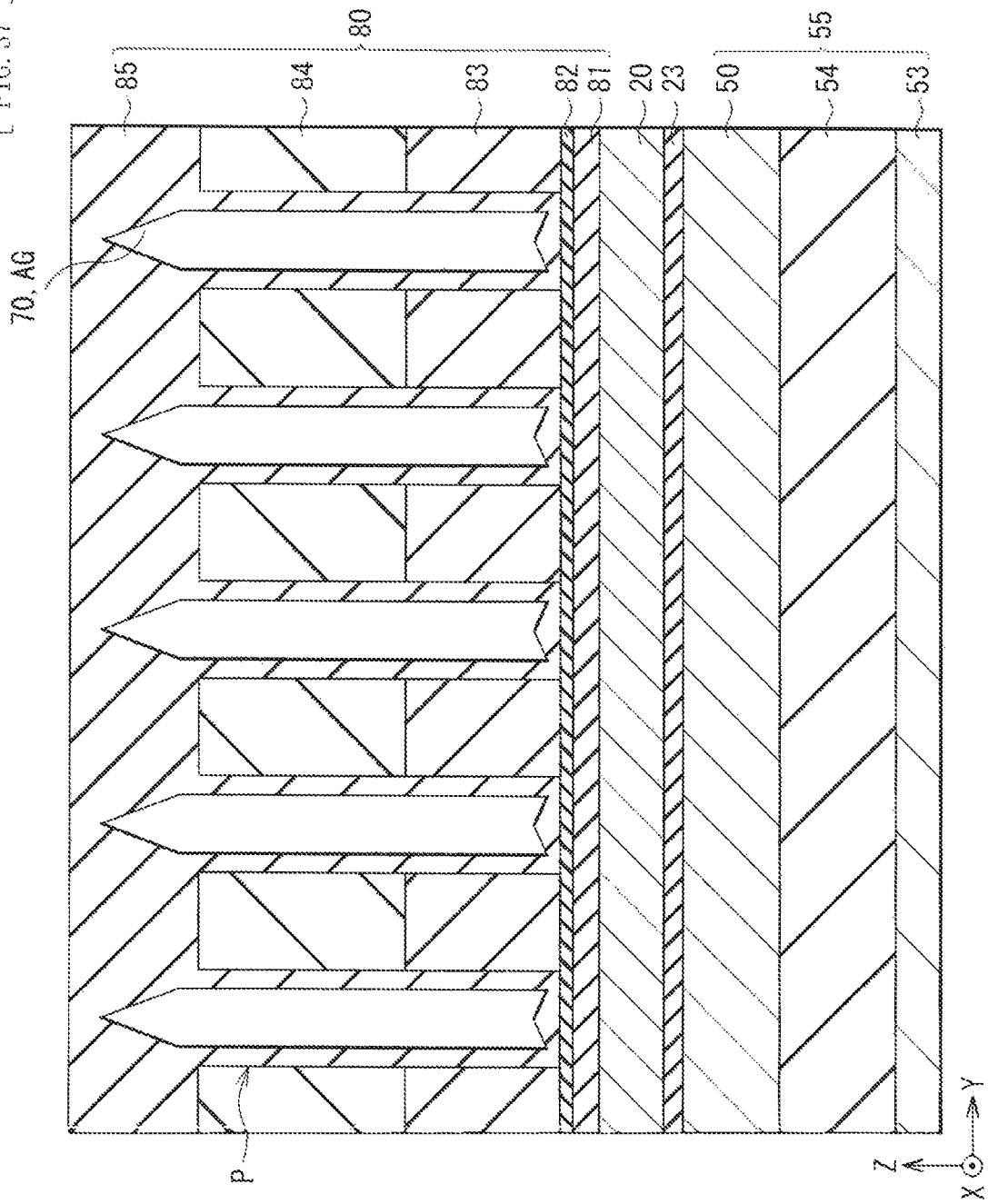

[ FIG. 38 ]
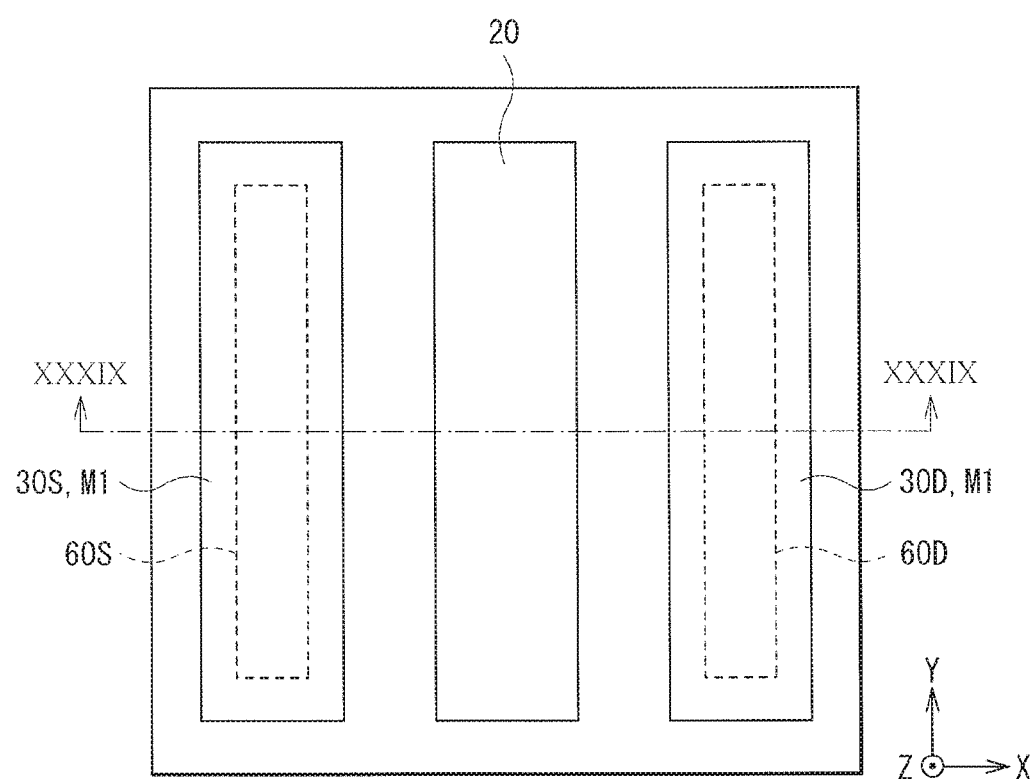

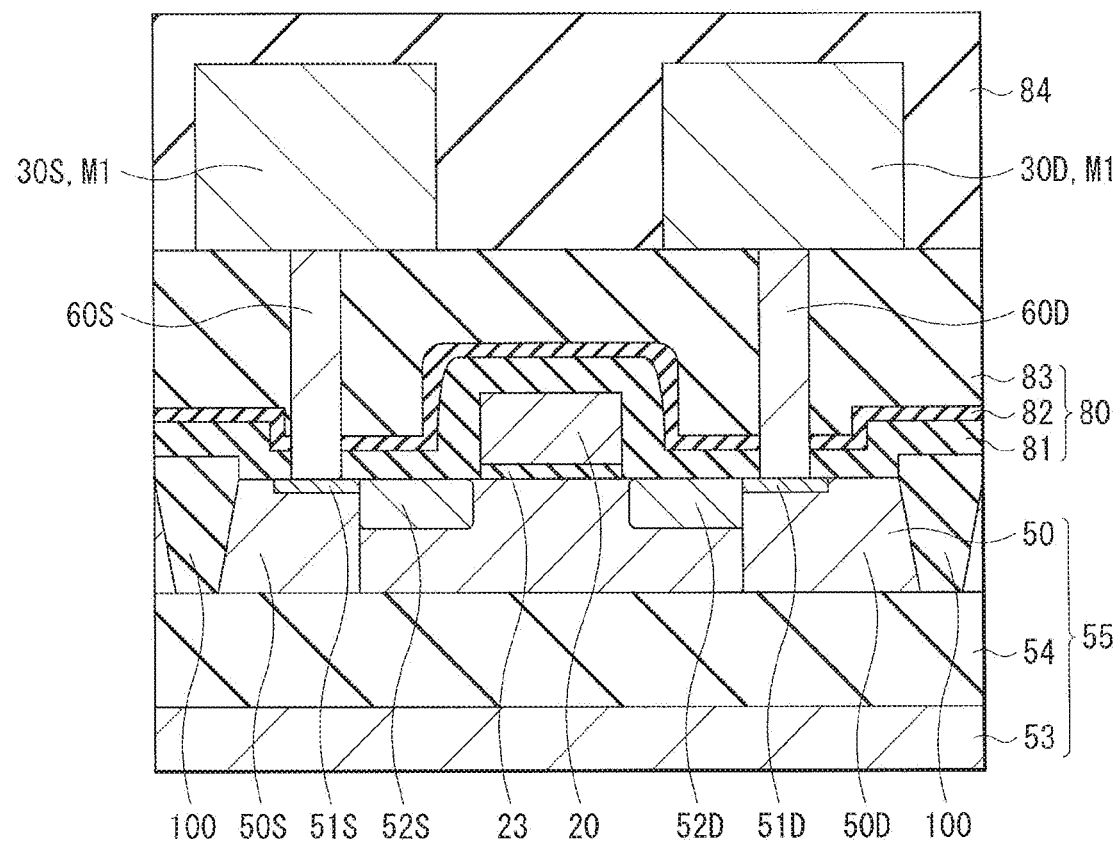
[FIG. 39]

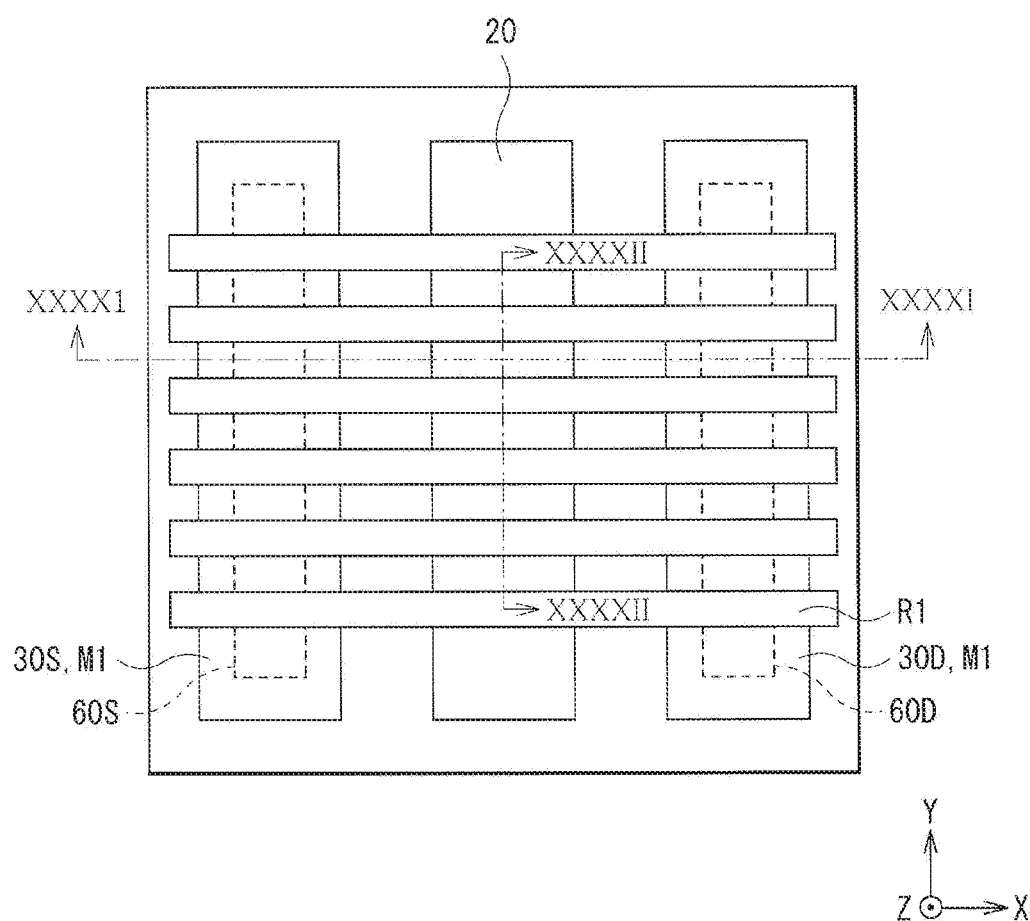
[FIG. 40]

[ FIG. 41 ]
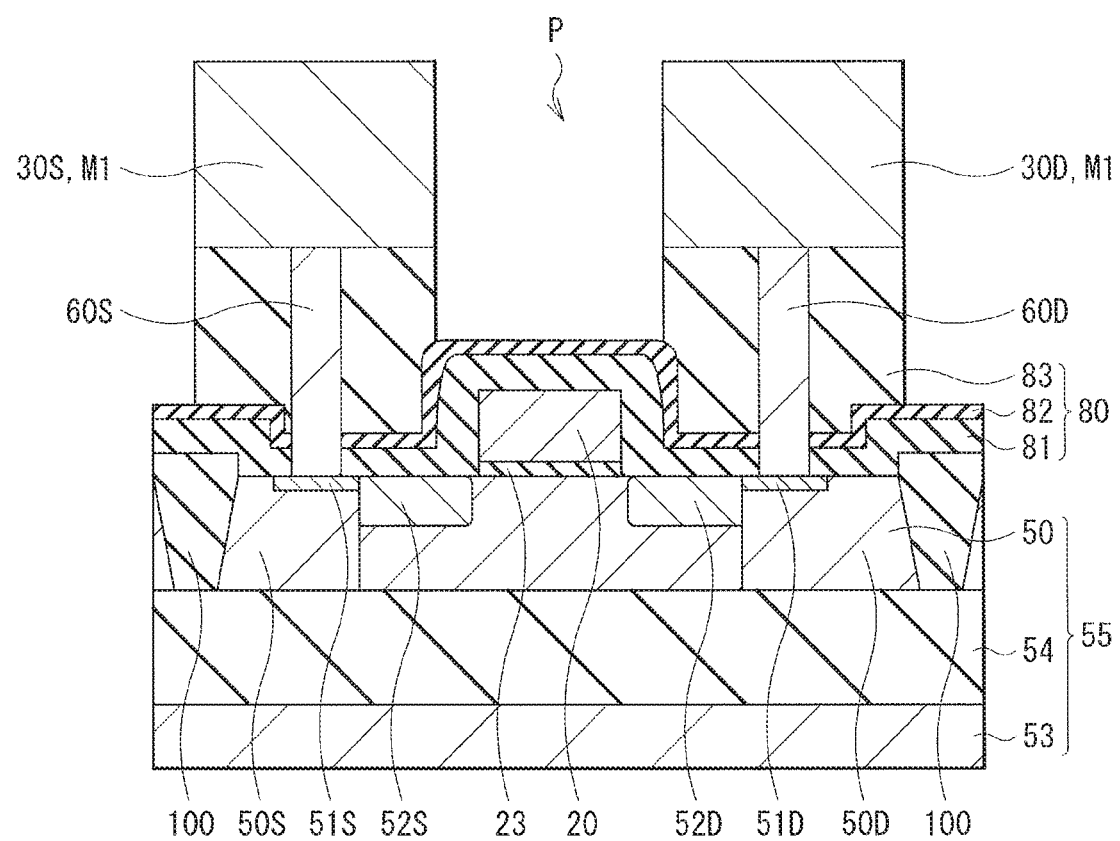

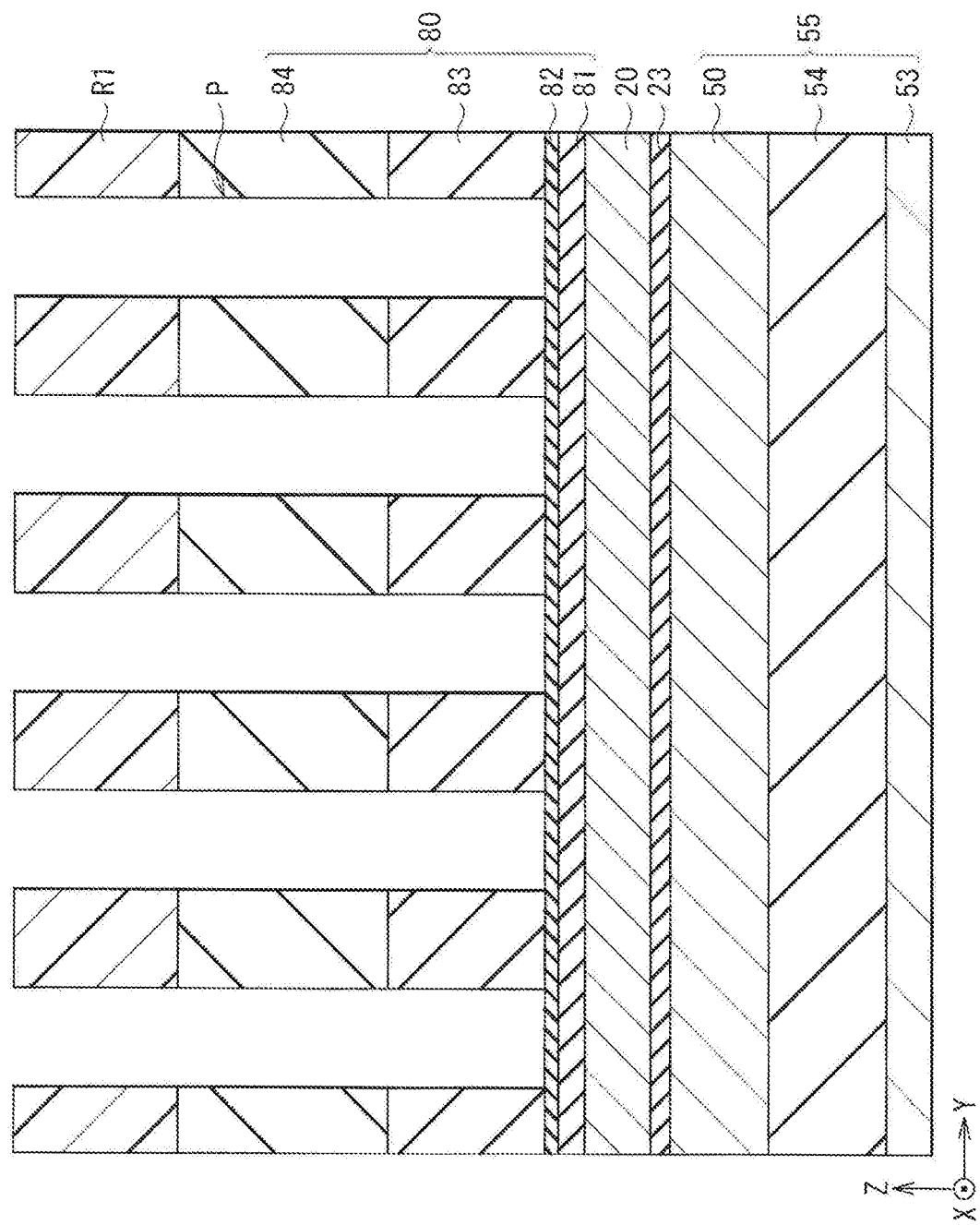
[FIG. 42]

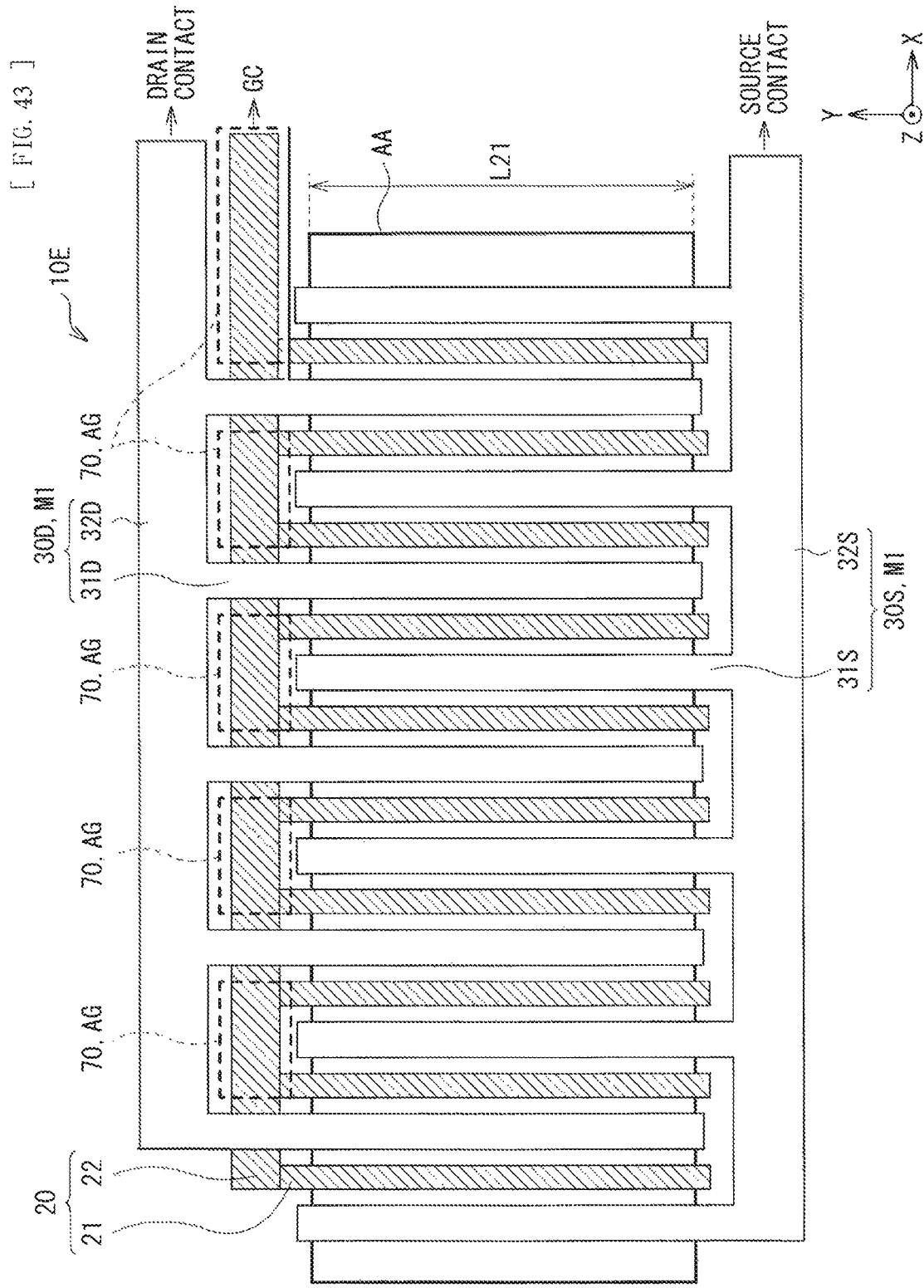
[FIG. 43]

[ FIG. 44 ]
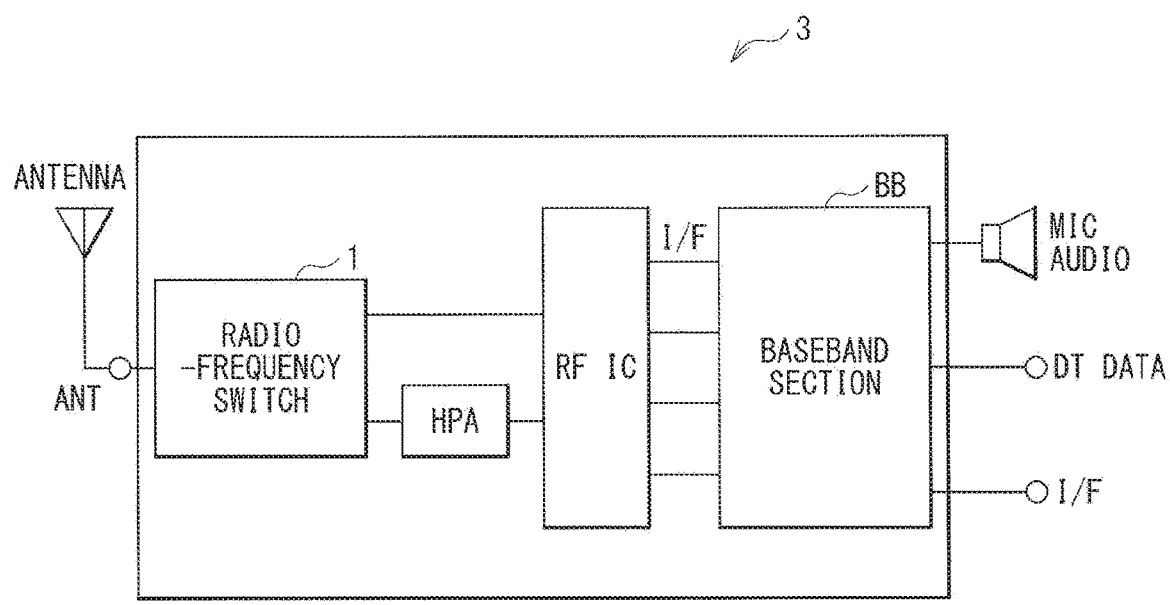

FIELD-EFFECT TRANSISTOR, METHOD OF MANUFACTURING THE SAME, AND RADIO-FREQUENCY DEVICE

CROSS REFERENCE TO RELATED APPLICATIONS

This Application is a Continuation Application of Application No. 16/050,815, filed Jul. 31, 2018 which is a Continuation Application of application Ser. No. 15/499,195, filed Apr. 27, 2017 which issued as U.S. Pat. No. 10,074,610 on Sep. 11, 2018, which is a Continuation Application of application Ser. No. 14/897,867, filed Dec. 11, 2015, which issued as U.S. Pat. No. 9,695,865 on May 23, 2016, which is a national stage of PCT/JP2015/059126, filed Mar. 25, 2015, which claims the benefit of Japanese Patent Application JP 2014-86805 filed on Apr. 18, 2014, the contents of which are incorporated herein by reference in their entirety.

TECHNICAL FIELD

The disclosure relates to a field-effect transistor (FET) suitable for, for example but not limited to, a switch device of a radio-frequency device, and a method of manufacturing the same, and a radio-frequency device including the field-effect transistor.

BACKGROUND ART

Radio-frequency switches (RF-SW) configured to turn on and off a radio frequency (RF) are used for front ends of portable communication terminals such as mobile phones. In such radio-frequency switches, a low loss of a radio frequency passing therethrough is an important characteristic. For such a low loss, it is important to reduce a resistance (on-resistance) of an FET in an on state or a capacitance (off-capacitance) of the FET in an off state, i.e., to reduce the product (Ron*Coff) of the on-resistance and the off-capacitance.

The off-capacitance includes a component (an intrinsic component) generated in, for example but not limited to, a diffusion layer and a substrate, and a component (an extrinsic component) generated in, for example but not limited to, a gate electrode, a contact plug, and a wiring line on the contact plug. For example, in the field of ultra-small MOSFETs, it is proposed to have an air gap around a gate electrode to reduce a parasitic capacitance between the gate electrode and a contact plug, thereby reducing an extrinsic component (for example, refer to Patent Literature 1).

CITATION LIST

Patent Literature

Patent Literature 1: Japanese Unexamined Patent Application Publication No. 2002-359369

SUMMARY OF INVENTION

In a configuration in Patent Literature 1, it is difficult to sufficiently reduce a parasitic capacitance between the gate electrode and a wiring line on the contact plug, a capacitance (an inter-wiring capacitance) generated between wiring lines on the contact plug, or any other capacitance, and there is still room for improvement.

It is desirable to provide a field-effect transistor that makes it possible to reduce an extrinsic component of an off-capacitance, and a method of manufacturing the same, and a radio-frequency device including the field-effect transistor.

A field-effect transistor according to an embodiment of the disclosure includes the following components (A) to (E).
  (A) a gate electrode
  (B) a semiconductor layer having a source region and a drain region with the gate electrode in between
  (C) contact plugs provided on the source region and the drain region
  (D) first metals stacked on the contact plugs
  (E) a low-dielectric constant region provided in a region between the first metals along an in-plane direction of the semiconductor layer and provided at least in a first region below bottom surfaces of the first metals along a stacking direction.

In the field-effect transistor according to the embodiment of the disclosure, the low-dielectric constant region is provided at least in the first region below the bottom surfaces of the first metals along the stacking direction in the region between the first metals along the in-plane direction of the semiconductor layer. This makes it possible to reduce a parasitic capacitance between the gate electrode and the contact plug, or a parasitic capacitance between the gate electrode and the first metal, thereby reducing an extrinsic component of an off capacitance.

A radio-frequency device according to an embodiment of the disclosure is provided with a field-effect transistor, and the field-effect transistor includes the following components (A) to (E).
  (A) a gate electrode
  (B) a semiconductor layer having a source region and a drain region with the gate electrode in between
  (C) contact plugs provided on the source region and the drain region
  (D) first metals stacked on the contact plugs
  (E) a low-dielectric constant region provided in a region between the first metals along an in-plane direction of the semiconductor layer and provided at least in a first region below bottom surfaces of the first metals along a stacking direction.

A method of manufacturing a field-effect transistor according to an embodiment of the disclosure includes the following (A) to (E).
  (A) forming a gate electrode on top surface side of a semiconductor layer
  (B) forming a source region and a drain region with the gate electrode in between in the semiconductor layer
  (C) providing contact plugs on the source region and the drain region
  (D) stacking first metals on the contact plugs
  (E) providing a low-dielectric constant region in a region between the first metals along an in-plane direction of the semiconductor layer and at least in a first region below bottom surfaces of the first metals along a stacking direction According to the field-effect transistor of the embodiment of the disclosure, the ratio-frequency device of the embodiment of the disclosure, and the method of manufacturing the field-effect transistor of the embodiment of the disclosure, the low-dielectric constant region is provided at least in the first region below the bottom surfaces of the first metals along the stacking direction in the region between the first metals along the in-plane direction of the semiconductor layer, which makes it possible to reduce the extrinsic component of the off-capacitance.

It is to be noted that effects of the embodiments of the disclosure are not limited to effects described here, and may include any effect described in the disclosure.

BRIEF DESCRIPTION OF DRAWINGS

FIG. 1 is a diagram illustrating an example of a radio-frequency switch including a field-effect transistor according to a first embodiment of the disclosure.

FIG. 2 is a diagram illustrating an SPST switch having a basic configuration of the radio-frequency switch illustrated in FIG. 1.

FIG. 3 is an equivalent circuit diagram of the SPST switch illustrated in FIG. 2.

FIG. 4 is an equivalent circuit diagram of the SPST switch illustrated in FIG. 3 in an on state.

FIG. 5 is an equivalent circuit diagram of the SPST switch illustrated in FIG. 3 in an off state.

FIG. 6 is a plan view illustrating an entire configuration of the field-effect transistor according to the first embodiment of the disclosure.

FIG. 7 is a sectional view taken along a line VII-VII of FIG. 6.

FIG. 8 is a diagram illustrating respective components of an off-capacitance of a typical field-effect transistor.

FIG. 9 is a sectional view illustrating Modification Example 1 of a low-dielectric constant region illustrated in FIG. 7.

FIG. 10 is a sectional view illustrating Modification Example 2 of the low-dielectric constant region illustrated in FIG. 7.

FIG. 11 is a sectional view illustrating a configuration of a field-effect transistor according to Reference Example 1.

FIG. 12 is a diagram illustrating simulation results of measuring a relationship between a width of the low-dielectric constant region and an extrinsic component of a capacitance in the embodiment illustrated in FIG. 7, Modification Example 2 illustrated in FIG. 10, and Reference Example 1 illustrated in FIG. 11.

FIG. 13 is a sectional view illustrating a positional relationship between the field-effect transistor and the low-dielectric constant region illustrated in FIG. 7, and a multilayer wiring section.

FIG. 14 is a plan view illustrating a positional relationship between the field-effect transistor and the low-dielectric constant region illustrated in FIG. 7, and a gate contact.

FIG. 15 is a sectional view taken along a line XV-XV of FIG. 14.

FIG. 16 is a sectional view taken along a line XVIA-XVIB of FIG. 14.

FIG. 17 is a sectional view taken along a line XVIIB-XVIIC of FIG. 14.

FIG. 18 is a sectional view taken along a line XVIIIC-XVIIID of FIG. 14.

FIG. 19 is a sectional view illustrating a method of manufacturing the field-effect transistor illustrated in FIG. 7 in process order.

FIG. 20 is a sectional view illustrating a process following FIG. 19.

FIG. 21 is a sectional view illustrating a process following FIG. 20.

FIG. 22 is a sectional view illustrating a process following FIG. 21.

FIG. 23 is a sectional view illustrating a process following FIG. 22.

FIG. 24 is a sectional view illustrating a process following FIG. 23.

FIG. 25 is a sectional view illustrating a process following FIG. 24.

FIG. 26 is a sectional view illustrating a process following FIG. 25.

FIG. 27 is a sectional view illustrating a process following FIG. 26.

FIG. 28 is a sectional view illustrating a process following FIG. 27.

FIG. 29 is a sectional view illustrating a process following FIG. 28.

FIG. 30 is a sectional view illustrating a process following FIG. 29.

FIG. 31 is a sectional view illustrating a process following FIG. 30.

FIG. 32 is a sectional view illustrating a configuration of a field-effect transistor according to a second embodiment of the disclosure.

FIG. 33 is a sectional view illustrating a configuration of a field-effect transistor according to a third embodiment of the disclosure.

FIG. 34 is a sectional view illustrating a configuration of a field-effect transistor according to a fourth embodiment of the disclosure.

FIG. 35 is a plan view illustrating a configuration of a field-effect transistor according to a fifth embodiment of the disclosure.

FIG. 36 is a sectional view taken along a line XXXVI-XXXVI of FIG. 35.

FIG. 37 is a sectional view taken along a line XXXVII-XXXVII of FIG. 35.

FIG. 38 is a plan view illustrating a method of manufacturing the field-effect transistor illustrated in FIG. 35 in process order.

FIG. 39 is a sectional view taken along a line XXXIX-XXXIX of FIG. 38.

FIG. 40 is a plan view illustrating a process following FIG. 38.

FIG. 41 is a sectional view taken along a line XXXXI-XXXXI of FIG. 40.

FIG. 42 is a sectional view taken along a line XXXXII-XXXXII of FIG. 40.

FIG. 43 is a plan view illustrating a configuration of a field-effect transistor according to a sixth embodiment of the disclosure.

FIG. 44 is a block diagram illustrating an example of a radio communication unit.

MODE FOR CARRYING OUT THE INVENTION

Some embodiments of the disclosure will be described in detail below with reference to the accompanying drawings. It is to be noted that description will be given in the following order.

1. First Embodiment (radio-frequency switch and field-effect transistor; an example in which a low-dielectric constant region is provided in a first region below a bottom surface of a first metal, a second region between the bottom surface and a top surface of the first metal, and a third region above the top surface of the first metal along a stacking direction)

2. Second Embodiment (field-effect transistor; an example in which a second metal is stacked on the first metal, and the low-dielectric constant region is so provided as to extend between second metals)

3. Third Embodiment (field-effect transistor; an example in which the low-dielectric constant region is provided with a larger width than a width of a region where a surface of a gate electrode is covered with a first insulating film and a second insulating film)

4. Fourth Embodiment (field-effect transistor; an example in which a first region and a second region of the low-dielectric constant region is filled with a fifth insulating film and a third region has an air gap)

5. Fifth Embodiment (field-effect transistor; an example in which the low-dielectric constant region is provided along a direction intersecting with the gate electrode)

6. Sixth Embodiment (field-effect transistor; an example in which the low-dielectric constant region is provided on a finger section of a gate electrode and at least a part of a coupling section)

7. Application Example (radio communication unit)

First Embodiment

FIG. 1 illustrates a configuration of a radio-frequency switch including a field-effect transistor according to a first embodiment of the disclosure. A radio-frequency switch 1 may be used for a front end of a portable information terminal such as a mobile phone, and may use various configurations such as SPST (Single Pole Single Through) illustrated in FIG. 2, SPDT (Single Pole Double Through), SP3T, and SPNT (where N is a real number) according to the number of input/output ports. FIG. 1 illustrates an example of a SP10T switch. The SP10T switch may include one pole coupled to an antenna ANT and ten contacts. The radio-frequency switch 1 may have various configurations, any of which is configured of a combination of SPST switches with a basic circuit configuration illustrated in FIG. 2.

FIG. 3 illustrates an equivalent circuit of an SPST switch 1A illustrated in FIG. 2. The SPST switch 1A may include, for example, a first port Port1 coupled to an antenna ANT, a second port Port2, a first switching device FET1, and a second switching device FET2. The first switching device FET1 is coupled between the first port Port1 and a ground. The second switching device FET2 is coupled between the first port Port1 and the second port Port2.

In the SPST switch 1A, on-off control is performed by application of control voltages Vc1 and Vc2, respectively, to gates of the first switching device FET1 and the second switching device FET2 through resistors. In an on state, as illustrated in FIG. 4 the first switching device FET2 is in a conduction state, and the first switching device FET1 is in a non-conduction state. In an off state, as illustrated in FIG. 5, the first switching device FET1 is in the conduction state, and the second switching device FET2 is in the non-conduction state.

On-resistances and off-capacitances of the first switching device FET1 and the second switching device FET2 are respectively represented by Ron/Wg1, Ron/Wg2, Coff*Wg1, and Coff*Wg2 using values Ron [Ωmm] and Coff [fF/mm] per unit length of an FET, and gate widths Wg1 and Wg2 [mm]. The on-resistances are inversely proportional to the gate widths Wg1 and Wg2, and the off-capacitances are proportional to the gate widths Wg1 and Wg2.

Another characteristic of the on-resistance and the off-capacitance is that a loss by the on-resistance is not dependent on frequency, whereas a capacitance loss increases with an increase in frequency. When a gate width Wg is increased in order to reduce a loss, a radio-frequency loss by an input capacitance is caused. For this reason, in order to reduce the loss with use of the largest possible gate width Wg, it is important to reduce both the values Ron and Coff per unit length, i.e., to minimize Ron*Coff (product).

FIG. 6 is a plan view illustrating an entire configuration of the field-effect transistor according to the first embodiment of the disclosure. The field-effect transistor 10 is a field-effect transistor for a radio-frequency device configuring the first switching device FET1 or the second switching device FET2 in the SPST switch 1A illustrated in FIG. 3, and includes a gate electrode 20, a source electrode 30S, and a drain electrode 30D.

The gate electrode 20 may have a multi-finger structure including a plurality of finger sections 21 that extend along a same direction (for example, a Y direction) and a coupling section (a gate routing wiring line) 22 configured to couple the plurality of finger sections 21 to one another. It is to be noted that the gate width Wg of the field-effect transistor 10 used for the radio-frequency switch 1 is much larger than that of a field-effect transistor used for, for example but not limited to, a logic in order to achieve a reduction in loss, and may be several hundreds of um to several mm. A length (finger length) L21 of the finger section 21 may be, for example, several tens of um. The coupling section 22 is coupled to a gate contact (not illustrated in FIG. 6, refer to FIG. 14). In FIG. 6, the gate electrode 20 is diagonally shaded.

It is to be noted that, in the following description and drawings, a length direction of the finger section 21 of the gate electrode 20 is the Y direction, a length direction of the coupling section 22 is an X direction, and a direction (a stacking direction) orthogonal to these directions is a Z direction.

As with the gate electrode 20, the source electrode 30S may include a plurality of finger sections 31S that extend along a same direction (for example, the Y direction) and a coupling section (a source routing wiring line) 32S configured to couple the plurality of finger section 31S to one another. The coupling section 32S is coupled to a source contact (not illustrated).

As with the gate electrode 20, the drain electrode 30D may include a plurality of finger sections 31D that extend along a same direction (for example, the Y direction) and a coupling section (drain routing wiring line) 32D configured to couple the plurality of finger sections 31D to one another. The coupling section 32D is coupled to a drain contact (not illustrated).

The finger sections 31S of the source electrode 30S and the finger sections 31D of the drain electrode 30D are alternately provided in gaps between the finger sections 21 of the gate electrode 20. The finger sections 21 of the gate electrode 20 and the finger sections 31S of the source electrode 30S are disposed inside an active region AA. The coupling section 22 of the gate electrode 20, the coupling section 32S of the source electrode 30S, and the coupling section 32D of the drain electrode 30D are disposed in a device isolation region AB (not illustrated in FIG. 6, refer to FIG. 14) outside the active region AA.

FIG. 7 illustrates a sectional configuration taken along a line VII-VII of FIG. 6, and illustrates one of the finger sections 21 of the gate electrode 20, and one of the finger sections 31S of the source electrode 30S and one of the finger sections 31D of the drain electrode 30D that are disposed on both sides of the one finger section 21. This field-effect transistor 10 includes the foregoing gate electrode 20, a semiconductor layer 50, contact plugs 60S and 60D, first metals M1, and a low-dielectric constant region 70.

The gate electrode 20 may be provided on the semiconductor layer 50 with a gate oxide film 23 in between. The gate electrode 20 may have, for example, a thickness of 150 nm to 200 nm both inclusive, and may be made of, for example, polysilicon. The gate oxide film 23 may have, for example, a thickness of about 5 nm to about 10 nm both inclusive, and may be made of, for example, silicon oxide ($SiO_2$).

The semiconductor layer 50 may be made of, for example, silicon (Si). The semiconductor layer 50 has a source region 50S and a drain region 50D both made of n-type ($n^+$) silicon with the gate electrode 20 in between. Low resistance regions 51S and 51D made of high-concentration n-type ($n^{++}$) silicon or silicide may be respectively provided on surfaces of the source region 50S and the drain region 50D for connection with the contact plugs 60S and 60D. Extension regions 52S and 52D made of low-concentration n-type ($n^-$) silicon may be respectively provided between the source region 50S and the gate electrode 20 and between the drain region 50D and the gate electrode 20.

The semiconductor layer 50 may be provided on a supporting substrate 53 with an embedded oxide film 54 in between. In other words, the supporting substrate 53, the embedded oxide film 54, and the semiconductor layer 50 configure a SOI (Silicon on Insulator) substrate 55. The supporting substrate 53 may be configured of, for example, a high-resistance silicon substrate. The embedded oxide film 54 may be made of, for example, $SiO_2$.

The contact plugs 60S and 60D are respectively coupled to the low-resistance regions 51S and 51D of the source region 50S. The contact plugs 60S and 60D may each have, for example, a laminate configuration (not illustrated) including a titanium (Ti) layer, a titanium nitride (TiN) layer, and a tungsten (W) layer. The titanium layer is a film configured to reduce contact resistance with a layer below the contact plugs 60S and 60D. The titanium nitride layer is a barrier metal configured to suppress diffusion of the tungsten layer provided inside the titanium nitride layer into silicon.

The first metals M1 may each include, for example, the source electrode 30S stacked on the contact plug 60S and the drain electrode 30D stacked on the contact plug 60D. The first metals M1 may each have, for example, a thickness from 500 nm to 1000 nm both inclusive, and may be made of, for example, aluminum (Al).

The low-dielectric constant region 70 is provided in a region between the first metals M1 along an XY-plane direction of the semiconductor layer 50, i.e., a region between the source electrode 30S and the drain electrode 30D (above the finger section 21 of the gate electrode 20). The low-dielectric constant region 70 is also provided at least in a first region A1 below bottom surfaces of the first metals M1 along a stacking direction Z. This makes it possible to reduce the extrinsic component of the off-capacitance in the field-effect transistor 10.

In other words, as illustrated in FIG. 8, the off-capacitance may include a component (intrinsic component) Cin generated in, for example but not limited to, the diffusion layer and the substrate, and a component (extrinsic component) Cex generated in, for example but not limited to, the contact plugs 60S and 60D and the first metals M1 disposed thereabove.

The intrinsic component Cin may include, for example, the following capacitances. The capacitances may include a capacitance Cssub or Cdsub generated between the source region 50S or the drain region 50D and the supporting substrate 53, a capacitance Csg or Cdg generated between the source region 50S or the drain region 50D and the gate electrode 20, a capacitance Cds generated between the source region 50S and the drain region 50D, and a capacitance Csb or Cdb generated between the source region 50S or the drain region 50D and a bottom (a body) of the semiconductor layer 50.

The extrinsic component Cex may include, for example, the following capacitances. The capacitances may include a capacitance between the gate electrode 20 and the contact plug 60S or 60D or a capacitance CgM between the gate electrode 20 and each of the first metals M1, and a capacitance (inter-wiring capacitance) CMM1 generated between the first metals M1.

It is to be noted that FIG. 8 illustrates respective components of an off-capacitance in a typical field-effect transistor. In FIG. 8, corresponding components are denoted by the same numerals as of the field-effect transistor 10 according to this embodiment illustrated in FIG. 7.

In order to reduce the off-capacitance, it is specifically effective to reduce the extrinsic component Cex. In this embodiment, the low-dielectric constant region 70 is provided in the foregoing regions along the XY-plane direction and the stacking direction Z to reduce the extrinsic component Cex. This makes it possible to reduce the product (Ron*Coff) of the on-resistance and the off-capacitance, thereby achieving a reduction in loss in the radio-frequency switch 1.

More specifically, as illustrated in FIG. 7, the low-dielectric constant region 70 may be preferably provided in the foregoing first region A1, a second region A2 between a bottom surface and a top surface of the first metal M1, and a third region A3 above the top surface of the first metal M1 along the stacking direction Z. This makes it possible to reduce the capacitance between the gate electrode 20 and the contact plug 60S or 60D or the capacitance CgM between the gate electrode 20 and each of the first metals M1, the capacitance (inter-wiring capacitance) CMM1 between the first metals M1, or any other capacitance, thereby reducing the extrinsic component Cex of the off-capacitance.

Modification Example 1

Alternatively, the low-dielectric constant region 70 may be provided in the first region A1 and the second region A2 along the stacking direction Z, as illustrated in FIG. 9. Even such a case makes it possible to reduce the capacitance between the gate electrode 20 and the contact plug 60S or 60D or the capacitance CgM between the gate electrode 20 and each of the first metals M1, the capacitance (inter-wiring capacitance) CMM1 between the first metals M1, or any other capacitance, thereby reducing the extrinsic component Cex of the off-capacitance.

Modification Example 2

Moreover, the low-dielectric constant region 70 may be provided in the first region A1 along the stacking direction Z as illustrated in FIG. 10. Even such a case makes it possible to reduce the capacitance between the gate electrode 20 and the contact plug 60S or 60D or the capacitance CgM between the gate electrode 20 and each of the first metals M1, or any other capacitance, thereby reducing the extrinsic component Cex of the off-capacitance.

Reference Example 1

FIG. 11 illustrates a sectional configuration of a field-effect transistor 10R according to Reference Example 1.

Reference Example 1 has the same configuration as that of the field-effect transistor 10 according to this embodiment illustrated in FIG. 7, except that the low-dielectric constant region 70 is provided in the second region A2 along the stacking direction Z.

(Simulation Results)

FIG. 12 illustrates simulation results of examining dependence of the extrinsic component Cex of the capacitance on a width W70 of the low-dielectric constant region 70 in this embodiment illustrated in FIG. 7, Modification Example 2 illustrated in FIG. 10, and Reference Example 1 illustrated in FIG. 11.

As can be seen from FIG. 12, the extrinsic component Cex of the capacitance tends to decrease with an increase in the width W70 of the low-dielectric constant region 70. Moreover, in Modification Example 2 in which the low-dielectric constant region 70 is provided in the first region A1 and the second region A2 along the stacking direction Z, compared to Reference Example 1 in which the low-dielectric constant region 70 is provided only in the second region A2 along the stacking direction Z, the extrinsic component Cex of the capacitance is more reduced. Further, it is shown that, in this embodiment in which the low-dielectric constant region 70 is provided in the first region A1, the second region A2, and the third region A3 along the stacking direction Z, it is possible to obtain an effect of reducing the extrinsic component Cex of the capacitance substantially equal to or higher than that in Modification Example 2 depending on a stretch length along the stacking direction Z of the low-dielectric constant region 70.

Moreover, the field-effect transistor 10 illustrated in FIG. 1 includes, on the semiconductor layer 50, one or more insulating films 80 and an opening (a recess) P opened from a top surface of the one or more insulating films 80 toward a top surface of the gate electrode 20. The low-dielectric constant region 70 may be preferably provided in the opening P. This makes it possible to have a wider width WP of the opening P. This solves an issue that, when an air gap is provided in proximity to the gate electrode 20 by wet etching, it is difficult for an etching solution to enter a narrow air gap. Thus, it is possible to improve etching uniformity in a wafer plane of the SOI substrate 55 and uniformity in characteristics of the field-effect transistor 10. Since the opening P is provided between the source electrode 30S and the drain electrode 30D, the width WP of the opening P may be preferably, for example, 100 nm to 1000 nm both inclusive.

The one or more insulating films 80 may preferably include a plurality of insulating films with different etching rates. This makes it possible to control a stop position of etching for the opening P with high accuracy with use of a difference in etching rate between the plurality of insulating films in a manufacturing process to be described later. Such control makes it possible to suppress a dose loss of an Si surface caused in a case where a surface of the gate electrode 20 is cut or a side surface of the gate electrode 20 is cut to cause etching to reach the Si surface, variation in gate length by side etching of the gate oxide film 23, an increase in variation in threshold voltage caused by the variation in gate length, thereby stably manufacturing the field-effect transistor 10 and improving reliability of the field-effect transistor 10.

More specifically, the one or more insulating films 80 may preferably include, for example, a first insulating film 81, a second insulating film 82, and a third insulating film 83. The surface (including the top surface and the side surface) of the gate electrode 20 and a top surface of the semiconductor layer 50 are covered with the first insulating film 81. A surface of the first insulating film 81 is covered with the second insulating film 82. The third insulating film 83 is provided between a surface of the second insulating film 82 and the bottom surface of the first metal M1. The second insulating film 82 may be preferably made of a material with a different etching rate from the etching rates of the first insulating film 81 and the third insulating film 83. For example, each of the first insulating film 81 and the third insulating film 83 may be preferably configured of, for example, a silicon oxide ($SiO_2$) film, and the second insulating film 82 may be configured of, for example, a silicon nitride (SiN) film. This allows the second insulating film 82 to have a function as an etching stopper layer. The opening P may be preferably opened to the top surface of the second insulating film 82 through at least the third insulating film 83.

Moreover, the one or more insulating films 80 may further include a fourth insulating film 84. A top surface of the third insulating film 83 and a surface (including the top surface and a side surface) of each of the first metals M1 are covered with the fourth insulating film 84. The opening P may be preferably opened from a top surface of the fourth insulating film 84 to the top surface of the second insulating film 82 through the fourth insulating film 84 and the third insulating film 83. The fourth insulating film 84 may be preferably configured of, for example, a silicon oxide ($SiO_2$) film.

The one or more insulating films 80 may further include a fifth insulating film 85 on the fourth insulating film 84. The low-dielectric constant region 70 may include an air gap AG provided at least in a part of the opening P. The configuration of the low-dielectric constant region 70 or the air gap AG is not specifically limited as long as the low-dielectric constant region 70 or the air gap AG has a lower dielectric constant than the dielectric constant of the silicon oxide ($SiO_2$ with a dielectric constant of 3.9) film forming the third insulating film 83 and the fourth insulating film 84, and the air gap AG may contain air (with a dielectric constant of 1.0), or may be in a vacuum. A top of the air gap AG may be preferably blocked by the fifth insulating film 85. Thus, the air gap AG is hermetically sealed by the fifth insulating film 85. A side surface and a bottom surface of the opening P may be covered with the fifth insulating film 85. The fifth insulating film 85 may be configured of, for example, a silicon oxide ($SiO_2$) film. It is to be noted that a sixth insulating film 86 made of, for example, silicon oxide ($SiO_2$) may be provided above the fifth insulating film 85 as necessary.

The low-dielectric constant region 70 may be preferably provided with, for example, a width W70 equal to or smaller than a width W82 of a region where the surface of the gate electrode 20 is covered with the first insulating film 81 and the second insulating film 82.

FIG. 13 illustrates a positional relationship along the stacking direction Z between the field-effect transistor 10 and the low-dielectric constant region 70 illustrated in FIG. 7, and a multilayer wiring section 90. The field-effect transistor 10 and the low-dielectric constant region 70 are provided in a device region AA1 of the active region AA. The multilayer wiring section 90 is provided in a wiring region AA2 outside the device region AA1 in the active region AA. The device region AA1 and the wiring region AA2 are separated by a device isolation layer 100 by an STI (Shallow Trench Isolation) method.

The multilayer wiring section 90 may include, for example, a first wiring layer 91 and a second wiring layer 92. The first wiring layer 91 may be disposed, for example, in the same layer as the source electrode 30S and the drain electrode 30D, i.e., the first metals M1. The second wiring layer 92 may serve as, for example, a second metal M2 above the first metal M1. The first wiring layer 91 and the second wiring layer 92 may be coupled to each other by, for example, a contact plug 93.

The low-dielectric constant region 70 is not provided between the first wiring layers 91 or between the second wiring layers 92 in the multilayer wiring section 90. In other words, the low-dielectric constant region 70 is provided inside the field-effect transistor 10 in the device region AA1 of the active region AA.

FIG. 14 illustrates a positional relationship along the XY-plane direction between the field-effect transistor 10 and the low-dielectric constant region 70 illustrated in FIG. 7, and a gate contact GC. The field-effect transistor 10 and the low-dielectric constant region 70 are provided in the active region AA. The gate contact GC is provided in the device isolation region AB outside the active region AA. The device isolation layer 100 by the STI method may be provided in the entire device isolation region AB instead of the semiconductor layer 50.

The finger sections 21 of the gate electrode 20, the finger sections 31S of the source electrode 30S, and the finger sections 31D of the drain electrode 30D are provided in the active region AA. The finger sections 21 of the gate electrode 20 extend along one direction (for example, the Y direction). The finger sections 31S of the source electrode 30S and the finger sections 31D of the drain electrode 30D extend in parallel with the finger sections 21 of the gate electrode 20 on both sides of the finger sections 21 of the gate electrode 20. The contact plugs 60S and 60D are respectively provided below the finger sections 31S of the source electrode 30S and the finger sections 31D of the drain electrode 30D, and extend in parallel with the finger sections 21 of the gate electrode 20. The low-dielectric constant region 70 is provided on the finger sections 21 of the gate electrode 20, and extends in parallel with the finger section 21 of the gate electrode 20. In other words, the low-dielectric constant region 70 is provided in a position superimposed on each of the finger sections 21 of the gate electrode 20 along the XY-plane direction.

The coupling section 22 of the gate electrode 20, the coupling section 32S of the source electrode 30S, the coupling section 32D of the drain electrode 30D are provided in the device isolation region AB. The coupling section 22 of the gate electrode 20 is coupled to the gate contact GC. The coupling section 32S of the source electrode 30S is coupled to the source contact (not illustrated). The coupling section 32D of the drain electrode 30D is coupled to the drain contact (not illustrated).

FIG. 15 illustrates a sectional configuration of the gate contact GC illustrated in FIG. 14. The gate contact GC may include the coupling section 22 of the gate electrode 20, a gate contact plug 24, and a gate contact layer 25 in this order on the device isolation layer 100 by the STI method. The gate contact plug 24 is provided in the same layer as the contact plugs 60S and 60D. The gate contact layer 25 is provided in the same layer as the source electrode 30S and the drain electrode 30D, i.e., the first metals M1.

FIG. 16 illustrates a sectional configuration taken along a line XVIA-XVIB of FIG. 14. FIG. 17 illustrates a sectional configuration taken along a line XVIIB-XVIIC of FIG. 14. FIG. 18 illustrates a sectional configuration taken along a line XVIIIC-XVIIID of FIG. 14.

As illustrated in FIGS. 14 to 18, the low-dielectric constant region 70 may be preferably provided while avoiding the gate contact GC. The reason for this is that, in a case where the low-dielectric constant region 70 is provided on the coupling section 22 of the gate contact GC, it is difficult to provide the gate contact plug 24 on the coupling section 22.

Moreover, the gate contact GC may be preferably covered with the one or more insulating films 80, i.e., the first to the sixth insulating films 81 to 86 as with the gate electrode 20 in the field-effect transistor 10. Reliability of the gate contact GC is maintained by covering the gate contact GC with the one or more insulating films 80.

For example, the field-effect transistor 10 may be manufactured as follows.

FIGS. 19 to 31 illustrate a method of manufacturing the field-effect transistor 10 in process order. First, as illustrated in FIG. 19, the SOI substrate 55 including the embedded oxide film 54 and the semiconductor layer 50 on the supporting substrate 53 is prepared, and the device isolation layer 100 by, for example, the STI method is formed on the semiconductor layer 50 of the SOI substrate 55 to partition the device region AA1 in the active region AA.

Subsequently, a silicon oxide film is formed as an implantation through film (not illustrated) by, for example, a thermal oxidation method, and well implantation and channel implantation are performed on the active region AA, and thereafter the implantation through film is removed. Subsequently, as illustrated in FIG. 20, the gate oxide film 23 made of, for example, silicon oxide is formed with a thickness of about 5 nm to about 10 nm both inclusive by the thermal oxidation method. Thereafter, a gate electrode material film (not illustrated) made of polysilicon is formed with a thickness of, for example, 150 nm to 200 nm both inclusive by, for example, a CVD (Chemical Vapor Deposition) method. The gate electrode material film is processed by, for example, photolithography and etching to form the gate electrode 20 on the top surface of the semiconductor layer 50 with the gate oxide film 23 in between, also as illustrated in FIG. 20.

After the gate electrode 20 is formed, as illustrated in FIG. 21, the extension regions 52S and 52D are formed on both sides of the gate electrode 20 with use of the gate electrode 20 and an offset spacer (not illustrated) as masks by implantation IMPL of arsenic (As) or phosphorus (P). Moreover, a side wall (not illustrated) is formed on the side surface of the gate electrode 20, and implantation of arsenic (As) or phosphorus (P) is performed. Accordingly, the source region 50S and the drain region 50D are formed on the semiconductor layer 50 with the gate electrode 20 in between. Thereafter, the side wall is removed.

After the source region 50S and the drain region 50D are formed, as illustrated in FIG. 22, the first insulating film 81 made of, for example, silicon oxide is formed with a thickness of several tens of nm, for example, 10 nm to 30 nm both inclusive on the surface of the gate electrode 20 and the top surface of the semiconductor layer 50 by, for example, a CVD method.

After the first insulating film 81 is formed, as illustrated in FIG. 23, the second insulating film 82 made of a material with a different etching rate from that of the first insulating film 81, for example, silicon nitride is formed with, for example, a thickness of several nm to several tens of nm, for example, 5 nm to 30 nm both inclusive on the surface of the first insulating film 81 by, for example, a CVD method.

After the second insulating film 82 is formed, as illustrated in FIG. 24, the third insulating film 83 made of silicon oxide is formed with, for example, a thickness of 500 nm to 1000 nm both inclusive on the second insulating film 82 by, for example, CVD.

After the third insulating film 83 is formed, as illustrated in FIG. 25, parts of the third insulating film 83, the second insulating film 82, and the first insulating film 81 are removed by photolithography and etching to form contact holes H1 in the source region 50S and the drain region 50D. As illustrated in a plan view in FIG. 14, the contact holes H1 are provided in parallel with the finger sections 21 of the gate electrode 20.

After the contact holes H1 are formed, as illustrated in FIG. 26, the low-resistance regions 51S and 51D are formed by implantation IMPL of arsenic (As) or phosphorus (P) of high concentration.

After the low-resistance regions 51S and 51D are formed, as illustrated in FIG. 27, the contact plugs 60S and 60D each having a laminate configuration of a titanium layer, a titanium nitride layer and a tungsten layer are formed in the respective contact holes H1. The contact plugs 60S and 60D are respectively provided on the source region 50S and the drain region 50D. Moreover, the contact plugs 60S and 60D are provided in parallel with the finger sections 21 of the gate electrode 20 as illustrated in the plan view in FIG. 14.

After the contact plugs 60S and 60D are formed, as illustrated in FIG. 28, the source electrode 30S and the drain electrode 30D made of aluminum (A1) are respectively formed as the first metals M1 on the contact plugs 60S and 60D. The finger sections 31S of the source electrode 30S and the finger sections 31D of the drain electrode 30D are provided in parallel with the finger sections 21 of the gate electrode 20 as illustrated in the plan view in FIG. 14.

After the source electrode 30S and the drain electrode 30D are formed, as illustrated in FIG. 29, the fourth insulating film 84 made of silicon oxide is formed on the top surface of the third insulating film 83 and the surfaces of the first metals M1 by, for example, a CVD method.

After the fourth insulating film 84 is formed, as illustrated in FIG. 30, the opening P is formed by photolithography and dry etching. The opening P is formed in a region between the first metals M1 along the XY-plane direction of the semiconductor layer 50, in particular, a region between the source electrode 30S and the drain electrode 30D (above the finger section 21 of the gate electrode 20). The width WP of the opening P may be, for example, 100 nm to 1000 nm both inclusive. At this time, the second insulating film 82 functions as an etching stopper, and etching for the opening P proceeds through the fourth insulating film 84 and the third insulating film 83 made of silicon oxide, and stops at the top surface of the second insulating film 82.

After the opening P is formed, as illustrated in FIG. 31, the fifth insulating film 85 made of silicon oxide is formed on the fourth insulating film 84 by, for example, a CVD method. The fifth insulating film 85 is deposited while overhanging the top of the opening P. Thus, the top of the opening P is blocked by the fifth insulating film 85 before the opening P is filled with the fifth insulating film 85, thereby forming the air gap AG hermetically sealed in the opening P. The side surface and the bottom surface of the opening P may be coated with the fifth insulating film 85. The air gap AG has a lower dielectric constant than dielectric constants of the third insulating film 84, the fourth insulating film 84, and the fifth insulating film 85 (silicon oxide with a dielectric constant of 3.9), thereby having a function as the low-dielectric constant region 70. The air gap AG may contain, but not specifically limited to, air (with a dielectric constant of 1.0) or may be, but not specifically limited to, in a vacuum. The air gap AG, i.e., the low-dielectric constant region 70 is provided continuously throughout the first region A1 below the bottom surface of the first metal M1, the second region A2 between the bottom surface and the top surface of the first metal M1, and the third region A3 above the top surface of the first metal.

Thereafter, as illustrated in FIG. 7, the sixth insulating film 86 is formed on the fifth insulating film 85 as necessary. It is to be noted, although not illustrated, an insulating film and a metal layer may be sequentially formed on the fifth insulating film 85 as with the first metals M1 to form the second metal M2, a third metal M3, and any other metal. Thus, the field-effect transistor 10 illustrated in FIG. 7 is completed.

In the field-effect transistor 10, the low-dielectric constant region 70 is provided, along the stacking direction Z, in the first region A1 below the bottom surface of the first metal M1, the second region A2 between the bottom surface and the top surface of the first metal M1, and the third region A3 above the top surface of the first metal M1 in a region between the first metals M1 along the XY-plane direction of the semiconductor layer 50. Thus, the capacitance between the gate electrode 20 and the contact plug 60S or 60D or the capacitance CgM between the gate electrode 20 and each of the first metals M1, or the capacitance (inter-wiring capacitance) CMM1 generated between the first metals M1, or any other capacitance are reduced to reduce the extrinsic component Cex of the off-capacitance.

In this embodiment, the low-dielectric constant region 70 is provided at least in the first region A1 below the bottom surface of the first metal M1 along the stacking direction Z in a region between the first metals M1 along the XY-plane direction of the semiconductor layer 50. This makes it possible to reduce the extrinsic component Cex of the off-capacitance and reduce the product (Ron*Coff) of the on-resistance and the off-capacitance, thereby facilitating a reduction in loss that is an important characteristic of the radio-frequency switch 1.

Moreover, the low-dielectric constant region 70 is provided throughout the foregoing first region A1, the foregoing second region A2, and the foregoing third region A3 along the stacking direction Z. This makes it possible to reduce the capacitance between the gate electrode 20 and the contact plug 60S or 60D or the capacitance CgM between the gate electrode 20 and each of the first metals M1, the capacitance (inter-wiring capacitance) CMM1 generated between the first metals M1, and any other capacitance, thereby reducing the extrinsic component Cex of the off-capacitance.

Further, the one or more insulating films 80 including a plurality of insulating films with different etching rates are provided on the semiconductor layer 50. This makes it possible to control the stop position of etching for the opening P with high accuracy with use of a difference in etching rate between the plurality of insulating films. Such control makes it possible to suppress a dose loss of an Si surface caused in a case where the surface of the gate electrode 20 is cut or the side surface of the gate electrode 20 is cut to cause etching to reach the Si surface, variation in gate length by side etching of the gate oxide film 23, an increase in variation in threshold voltage caused by the variation in gate length, thereby stably manufacturing the field-effect transistor 10 and improving reliability of the field-effect transistor 10.

In addition, the opening P is opened from the top surface of the one or more insulating films 80 toward the top surface of the gate electrode 20, and the low-dielectric constant region 70 is provided in the opening P. This makes it possible to have a wide width WP of the opening P. This solves an issue that, when an air gap is provided in proximity to the gate electrode 20 by wet etching, it is difficult for an etching solution to enter a narrow air gap. Thus, it is possible to improve etching uniformity in a wafer plane of the SOI substrate 55 and uniformity of characteristics of the field-effect transistor 10.

Second Embodiment

In the foregoing first embodiment, description is given of the case where only the first metals M1 are respectively stacked on the contact plugs 60S and 60D. However, the disclosure is applicable to a case where the second metals M2 are stacked on the first metals M1 such as a field-effect transistor 10A illustrated in FIG. 32. Moreover, in this case, providing the low-dielectric constant region 70 to extend between the second metals M2 makes it possible to reduce a capacitance (inter-wiring capacitance) CMM2 between the second metals M2, thereby further reducing the extrinsic component Cex of the off-resistance.

The second metals M2 are provided between the fourth insulating film 84 and the fifth insulating film 85. Each of the first metals M1 and corresponding one of the second metals M2 are coupled to each other by a contact plug 94. Moreover, the one or more insulating films 80 may further include a seventh insulating film 87 covering the top surface of the fourth insulating film 84 and surfaces of the second metals M2. The opening P is opened from a top surface of the seventh insulating film 87 to the top surface of the second insulating film 82 through the seventh insulating film 87, the fourth insulating film, and the third insulating film 83. The air gap AG similar to that in the first embodiment is provided as the low-dielectric constant region 70 in the opening P.

The air gap AG is provided in the first region A1 below the bottom surface of the first metal M1, the second region A2 between the bottom surface and the top surface of the first metal M1, and the third region A3 above the top surface of the first metal M1 along the stacking direction Z. In the third region A3, the air gap AG is provided between the first metals M1 and between the second metals M2. Accordingly, in this embodiment, as with the foregoing first embodiment, in addition to reducing the capacitance between the gate electrode 20 and the contact plug 60S or 60D or the capacitance CgM between the gate electrode 20 and each of the first metals M1, or the capacitance (inter-wiring capacitance) CMM1 generated between the first metals M1, the capacitance (inter-wiring capacitance) CMM2 generated between the second metals M2 is reduced to reduce the extrinsic component Cex of the off-resistance.

Third Embodiment

Moreover, in the foregoing first embodiment, description is given of the case where the low-dielectric constant region 70 is provided with the width W70 equal to or smaller than the width W82 of the region where the surface of the gate electrode 20 is covered with the first insulating film 81 and the second insulating film 82. However, in a case where the width of the finger section 21 of the gate electrode 20 is reduced, as with a field-effect transistor 10B illustrated in FIG. 33, the low-dielectric constant region 70 may be provided with the width W70 larger than the width W82 of the region where the surface of the gate electrode 20 is covered with the first insulating film 81 and the second insulating film 82.

Fourth Embodiment

Further, in the foregoing first embodiment, description is given of the case where the air gap AG hermetically sealed in the opening P is provided as the low-dielectric constant region 70. However, the low-dielectric constant region 70 is not limited to the air gap AG, and may be made of a material with a lower dielectric constant than the dielectric constants of the third insulating film 83 and the fourth insulating film 84 (insulating films penetrated by the opening P). More specifically, for example, in a case where the third insulating film 83 and the fourth insulating film 84 are silicon oxide ($SiO_2$ with a dielectric constant of 3.9) films, the fifth insulating film 85 may be made of SiOC (carbon-doped silicon oxide with a dielectric constant of 2.9), and at least a part of the opening P may be filled with the fifth insulating film 85. For example, as with a field-effect transistor 10C illustrated in FIG. 34, the first region A1 and the second region A2 of the low-dielectric constant region may be filled with the fifth insulating film 85 with a lower dielectric constant than the dielectric constants of the third insulating film 83 and the fourth insulating film 84. Moreover, the air gap AG may be provided in the third region A3 of the low-dielectric constant region 70.

Fifth Embodiment

In addition, in the foregoing first embodiment, description is given of the case where the low-dielectric constant region 70 extends in parallel with the finger sections 21 of the gate electrode 20. However, as with a field-effect transistor 10D illustrated in FIGS. 35 to 37, the low-dielectric constant region 70 may extend in a direction intersecting with the finger sections 21 of the gate electrode 20, for example, a direction (an X direction) perpendicular to the finger sections 21 of the gate electrode 20. This makes it possible to reduce an influence of misalignment between the gate electrode 20, the opening P, and the low-dielectric constant region 70. Moreover, in this case, a plurality of low-dielectric constant regions 70 may be provided side by side along the extending direction (Y direction) of the finger sections 21 of the gate electrode 20.

FIGS. 38 to 42 illustrate a method of manufacturing the field-effect transistor 10 according to this embodiment in process order. It is to be noted that processes overlapping with those in the first embodiment will be described referring to FIGS. 19 to 31.

First, as illustrated in FIGS. 38 and 39, as with the first embodiment, the gate electrode 20 is formed on the top surface of the semiconductor layer 50 by the processes illustrated in FIGS. 19 to 29, and the source region 50S and the drain region 50D are formed in the semiconductor layer 50, and thereafter, the first to third insulating films 81 to 83, the contact plugs 60S and 60D, the first metals M1, and the fourth insulating film 84 are formed.

Subsequently, as illustrated in FIGS. 40 to 42, a resist film R1 is formed on the fourth insulating film 84, and the opening P is formed by dry etching using the resist film R1 as a mask.

Subsequently, the resist film R1 is removed, and as illustrated in FIGS. 35 to 37, the fifth insulating film 85 is formed on the fourth insulating film 84, and the top of the opening P is blocked by the fifth insulating film 85 to form the air gap AG hermetically sealed in the opening P. Thus, the field-effect transistor 10D illustrated in FIGS. 35 to 37 is completed.

Sixth Embodiment

Furthermore, in the foregoing first embodiment, description is given of the case where the low-dielectric constant region 70 (such as the air gap AG) is provided above the finger sections 21 of the gate electrode 20 in the active region AA as illustrated in FIG. 14. However, as with a field-effect transistor 10E illustrated in FIG. 43, the low-dielectric constant region 70 may be provided above the finger sections 21 or above at least a part of the coupling section 22. More specifically, the low-dielectric constant region 70 may be preferably provided above a region avoiding the finger sections 31D and the coupling section 32D of the drain electrode 30D in the coupling section 22. It is to be noted that, in FIG. 43, the low-dielectric constant region 70 above the finger sections 21 of the gate electrode 20 is omitted.

Application Example

FIG. 44 illustrates an example of a radio communication unit. The radio communication unit 3 may be, for example, a mobile phone system having multiple functions such as audio, data communication, and LAN connection. A radio-frequency module 3 may include, for example, an antenna ANT, the radio-frequency switch 1, a high power amplifier HPA, a radio frequency integrated circuit RFIC, a baseband section BB, an audio output section MIC, a data output section DT, and an interface section I/F (for example, a wireless LAN (W-LAN; Wireless Local Area Network)) such as Bluetooth (registered trademark). The radio-frequency switch 1 is configured of the radio-frequency switch 1 described referring to FIGS. 1 to 5 in the first embodiment. The radio frequency integrated circuit RFIC and the baseband section BB are coupled to each other by the interface section I/F.

In the radio communication unit 3, upon transmission, i.e., in a case where a transmission signal is outputted from a transmission system of the radio communication unit 3 to the antenna ANT, the transmission signal outputted from the baseband section BB is outputted to the antenna ANT through the radio frequency integrated circuit RFIC, the high power amplifier HPA, and the radio-frequency switch 1.

Upon reception, i.e., in a case where the signal received by the antenna is inputted to a reception system of the radio communication unit 3, the received signal is inputted to the baseband section BB through the radio-frequency switch 1 and the radio frequency integrated circuit RFIC. The signal processed by the baseband section BB is outputted from an output section such as the audio output section MIC, the data output section DT, and the interface section I/F.

Although the disclosure is described referring to the foregoing embodiments, the disclosure is not limited thereto, and may be variously modified.

Moreover, for example, in the foregoing embodiments, the specific configurations of the radio-frequency switch 1, the field-effect transistor 10, the radio communication unit 3 are described; however, they are not limited to configurations including all the components illustrated in the drawings. Moreover, some of the components may be replaced by other components.

In addition, in the foregoing embodiments, description is given of the case where the field-effect transistor 10 is applied to the radio-frequency switch 1 of the radio communication unit 3; however, the field-effect transistor 10 is applicable to other radio frequency devices such as a PA (Power Amplifier) in addition to the radio-frequency switch (RF-SW).

Moreover, the shape, the material, and thickness of each layer, the film formation method, or any other condition are not limited to those described in the foregoing embodiments, and any other shape, any other material, any other thickness, or any other film formation method may be employed.

Furthermore, for example, in the foregoing embodiments, description is given of the case where the supporting substrate 53 of the SOI substrate 55 is a high-resistance silicon substrate. However, the SOI substrate 55 may be a so-called SOS (Silicon on Sapphire) substrate including the supporting substrate 53 made of sapphire. Since the supporting substrate 53 made of sapphire has insulating properties, the field-effect transistor 10 formed on the SOS substrate exhibits characteristics similar to those of a compound-based FET such as a GaAs-based FET. It is to be noted that the disclosure is not limited to the SOI substrate or the SOS substrate, and the disclosure is applicable to a case where the field-effect transistor 10 is formed on a bulk substrate.

It is to be noted that the effects described in this description are non-limiting examples, and any other effects may be included.

It is to be noted that the technology may have following configurations.

(1) A field-effect transistor including:
a gate electrode;
a semiconductor layer having a source region and a drain region with the gate electrode in between;
contact plugs provided on the source region and the drain region;
first metals stacked on the contact plugs; and
a low-dielectric constant region provided in a region between the first metals along an in-plane direction of the semiconductor layer and provided at least in a first region below bottom surfaces of the first metals along a stacking direction.

(2) The field-effect transistor according to (1), in which the low-dielectric constant region is provided in the first region and a second region between the bottom surfaces of the first metals and top surfaces of the first metals, along the stacking direction.

(3) The field-effect transistor according to (2), in which the low-dielectric constant region is provided in the first region, the second region, and a third region above the top surfaces of the first metals, along the stacking direction.

(4) The field-effect transistor according to (3), further including:
one or more insulating films provided on the semiconductor layer; and
an opening opened from a top surface of the one or more insulating films toward a top surface of the gate electrode,
in which the low-dielectric constant region is provided in the opening.

(5) The field-effect transistor according to (4), in which the one or more insulating films include a plurality of insulating films with different etching rates.

(6) The field-effect transistor according to (4) or (5), in which
the one or more insulating films include
a first insulating film covering a surface of the gate electrode and a top surface of the semiconductor layer,
a second insulating film covering a surface of the first insulating film, and
a third insulating film provided between a surface of the second insulating film and the bottom surfaces of the first metals, and the second insulating film is made of a material with a different etching rate from etching rates of the first insulating film and the third insulating film, and the opening is opened to a top surface of the second insulating film through at least the third insulating film.

(7) The field-effect transistor according to (6), in which the one or more insulating films further include a fourth insulating film covering a top surface of the third insulating film and surfaces of the first metals, and the opening is opened from a top surface of the fourth insulating film to the top surface of the second insulating film.

(8) The field-effect transistor according to (7), in which the one or more insulating films further include a fifth insulating film on the fourth insulating film, the low-dielectric constant region includes an air gap provided at least in a part of the opening, and a top of the air gap is blocked by the fifth insulating film.

(9) The field-effect transistor according to (8), in which a side surface and a bottom surface of the opening are covered with the fifth insulating film.

(10) The field-effect transistor according to any one of (6) to (9), in which the low-dielectric constant region is provided with a width equal to or smaller than a width of a region where the surface of the gate electrode is covered with the first insulating film and the second insulating film.

(11) The field-effect transistor according to any one of (1) to (10), in which the gate electrode extends along one direction, and the contact plugs, the first metals, and the low-dielectric constant region extend in parallel with the gate electrode.

(12) The field-effect transistor according to any one of (1) to (11), further including:

a device region in which the source region and the drain region are provided in the semiconductor layer;

a wiring region including a multilayer wiring section; and a device isolation layer that partitions the device region and the wiring region, in which the low-dielectric constant region is provided in the device region.

(13) The field-effect transistor according to (12), further including:

an active region including the device region and the wiring region; and a device isolation region provided outside the active region, and including the device isolation layer, in which the device isolation region includes a gate contact coupled to the gate electrode and provided on the device isolation layer, and the low-dielectric constant region is provided while avoiding the gate contact.

(14) The field-effect transistor according to (8), further including a second metal between the fourth insulating film and the fifth insulating film, in which the one or more insulating films further include a seventh insulating film covering a top surface of the fourth insulating film and a surface of the second metal, and the opening is opened from a top surface of the seventh insulating film to the top surface of the second insulating film.

(15) The field-effect transistor according to any one of (6) to (9), in which the low-dielectric constant region is provided with a larger width than a width of a region where the surface of the gate electrode is covered with the first insulating film and the second insulating film.

(16) The field-effect transistor according to (7), in which the low-dielectric constant region includes a fifth insulating film that fills at least a part of the opening, the fifth insulating film being made of a material with a lower dielectric constant than dielectric constants of the third insulating film and the fourth insulating film.

(17) The field-effect transistor according to any one of (1) to (16), in which the gate electrode extends along one direction, the contact plugs and the first metals extend in parallel with the gate electrode, and the low-dielectric constant region extends along a direction intersecting with the gate electrode.

(18) The field-effect transistor according to any one of (1) to (17), in which the gate electrode includes a plurality of finger sections extending along a same direction, and a coupling section that couples the plurality of finger sections to one another, and the low-dielectric constant region is provided above the finger sections or above at least a part of the coupling section.

(19) A radio frequency device provided with a field-effect transistor, the field-effect transistor including:

a gate electrode;

a semiconductor layer having a source region and a drain region with the gate electrode in between;

contact plugs provided on the source region and the drain region;

first metals stacked on the contact plugs; and a low-dielectric constant region provided in a region between the first metals along an in-plane direction of the semiconductor layer and provided at least in a first region below bottom surfaces of the first metals along a stacking direction.

(20) A method of manufacturing a field-effect transistor including:

forming a gate electrode on top surface side of a semiconductor layer;

forming a source region and a drain region with the gate electrode in between in the semiconductor layer;

providing contact plugs on the source region and the drain region;

stacking first metals on the contact plugs; and providing a low-dielectric constant region in a region between the first metals along an in-plane direction of the semiconductor layer and at least in a first region below bottom surfaces of the first metals along a stacking direction.

This application claims the benefit of Japanese Priority Patent Application JP 2014-86805 filed on Apr. 18, 2014, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A field-effect transistor comprising:

a gate electrode;

a semiconductor layer having a source region and a drain region with the gate electrode in between;

contact plugs comprising a first conductive material, wherein a first contact plug of the contact plugs is provided on the source region, and wherein a second contact plug of the contact plugs is provided on the drain region;
first metals, wherein one of the first metals is stacked on the first contact plug, and wherein a second one of the first metals is stacked on the second contact plug;
one or more insulating films provided in at least one of
a first region below bottom surfaces of the first metals along a stacking direction and between the contact plugs along an in-plane direction of the semiconductor layer,
a second region between top surfaces of the first metals and the bottom surfaces of the first metals along the stacking direction and between the contact plugs along an in-plane direction of the semiconductor layer, and
a third region above the top surfaces of the first metals along the stacking direction and between the contact plugs along an in-plane direction of the semiconductor layer, and
a low-dielectric constant region provided at least in the second region.

2. The field-effect transistor according to claim 1, wherein the first metals comprising a second conductive material that is different from the first conductive material.

3. The field-effect transistor according to claim 1, wherein the low-dielectric constant region comprises a cavity.

4. The field-effect transistor according to claim 1, wherein the one or more insulating films include
a first insulating film at least extending along a side surface of the gate electrode,
a second insulating film, at least a portion of the first insulating film provided between the second insulating film and the gate electrode.

5. The field-effect transistor according to claim 4, wherein the second insulating film at least extending along the side surface of the gate electrode.

6. The field-effect transistor according to claim 4, wherein the one or more insulating films further includes a third insulating film provided between the contact plugs along the in-plane direction, wherein the low-dielectric constant region comprises a cavity, and wherein the third insulating film is positioned outside a side section of the cavity.

7. The field-effect transistor according to claim 6, wherein the third insulating film is provided below the bottom surfaces of the first metals along the stacking direction.

8. The field-effect transistor according to claim 6, wherein the third insulating film is provided above the top surfaces of the first metals along the stacking direction.

9. The field-effect transistor according to claim 6, wherein the one or more insulating films further include a fourth insulating film above a top surface of the third insulating film, and wherein the cavity is below the fourth insulating film in the stacking direction.

10. The field-effect transistor according to claim 9, wherein at least one of the first insulating film, the second insulating film, the third insulating film, and the fourth insulating film is provided between the cavity and the gate electrode.

11. The field-effect transistor according to claim 1, wherein the low-dielectric constant region comprises a cavity, wherein, as viewed in a cross section including the stacking direction and a direction from the source region to the drain region, the cavity over the gate electrode is a single cavity.

12. The field-effect transistor according to claim 1, wherein the low-dielectric constant region is provided in the first region.

13. The field-effect transistor according to claim 1, wherein the low-dielectric constant region is provided in the third region.

14. The field-effect transistor according to claim 1, further comprising
an active region including
the gate electrode,
the semiconductor layer,
the contact plugs, and
an isolation region provided outside the active region, the isolation region including a gate contact coupled to the gate electrode.

15. The field-effect transistor according to claim 1, further comprising:
a device region in which the source region and the drain region are provided in the semiconductor layer, the device region including the low-dielectric constant region;
a wiring region including a multilayer wiring section; and
a device isolation layer that partitions the device region and the wiring region.

16. The field-effect transistor according to claim 1, wherein the low-dielectric constant region includes a first portion and a second portion.

17. The field-effect transistor according to claim 16, wherein the first portion is positioned in the second region and the second portion is positioned in the third region.

18. The field-effect transistor according to claim 17, wherein the first portion is positioned in the second region and the first region.

19. The field-effect transistor according to claim 16, wherein the first portion has a first width in a direction that is traverse to the stacking direction and the second portion has a second width in the direction that is traverse to the stacking direction that is different than the first width.

20. The field-effect transistor according to claim 19, wherein the gate electrode has a third width in the direction that is traverse to the stacking direction, and wherein the third width is smaller than one of the first width or the second width.

21. The field-effect transistor according to claim 19, wherein the gate electrode has a third width in the direction that is traverse to the stacking direction, and wherein the third width is larger than one of the first width or the second width.

22. The field-effect transistor according to claim 16, wherein the first portion is positioned in the first region and the second portion is positioned in the second region.

23. The field-effect transistor according to claim 22, wherein the first portion is symmetrical with the second portion.

24. The field-effect transistor according to claim 16, wherein the low-dielectric constant region includes a third portion that is positioned in the third region.

25. The field-effect transistor according to claim 24, wherein the first portion is symmetrical with the second portion, and wherein the second portion is symmetrical with the third portion.

26. The field-effect transistor according to claim 24, wherein the first portion is asymmetrical with the second portion, and wherein the second portion is asymmetrical with the third portion.

27. The field-effect transistor according to claim 24, wherein the first portion has a first width in a direction that is traverse to the stacking direction, wherein the second portion has a second width in the direction that is traverse to the stacking direction that is different than the first width, and the third portion has a third width in the direction that is traverse to the stacking direction that is different than the first width and the second width.

28. The field-effect transistor according to claim 27, wherein the gate electrode has a fourth width in the direction that is traverse to the stacking direction, and wherein the fourth width is smaller than one of the first width, the second width, or the third width.

29. The field-effect transistor according to claim 27, wherein the gate electrode has a fourth width in the direction that is traverse to the stacking direction, and wherein the fourth width is larger than one of the first width, the second width, or the third width.

* * * * *